(12) United States Patent
Tu et al.

(10) Patent No.: US 12,298,667 B2
(45) Date of Patent: *May 13, 2025

(54) LITHOGRAPHY

(71) Applicant: Taiwan Semiconductor Manufacturing Company, Ltd., Hsinchu (TW)

(72) Inventors: Meng-Che Tu, Hsinchu (TW); Po-Han Wang, Hsinchu (TW); Sih-Hao Liao, New Taipei (TW); Yu-Hsiang Hu, Hsinchu (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/398,152

(22) Filed: Dec. 28, 2023

(65) Prior Publication Data
US 2024/0126174 A1  Apr. 18, 2024

Related U.S. Application Data

(63) Continuation of application No. 17/461,983, filed on Aug. 30, 2021, now Pat. No. 11,892,774.

(51) Int. Cl.
*G03F 7/20* (2006.01)
*G03F 7/039* (2006.01)
*H01L 21/027* (2006.01)
*H01L 21/768* (2006.01)

(52) U.S. Cl.
CPC ........ *G03F 7/2022* (2013.01); *H01L 21/0274* (2013.01); *H01L 21/76802* (2013.01); *G03F 7/039* (2013.01)

(58) Field of Classification Search
CPC ... G03F 7/2022; G03F 7/039; H01L 21/0274; H01L 21/76802; H01L 21/31144; H01L 21/76816
USPC .................. 438/780; 430/311, 296, 320, 396
See application file for complete search history.

(56) References Cited

U.S. PATENT DOCUMENTS 11,892,774 B2 * 2/2024 Tu ........................ H01L 21/0274

* cited by examiner

*Primary Examiner* — Caleen O Sullivan
(74) *Attorney, Agent, or Firm* — JCIPRNET

(57) ABSTRACT

A method includes the following steps. A photoresist is exposed to a first light-exposure through a first mask, wherein the first mask includes a first stitching region, and a first portion of the photoresist corresponding to a first opaque portion of the first stitching region is unexposed. The photoresist is exposed to a second light-exposure through a second mask, wherein the second mask includes a second stitching region, and a second portion of the photoresist corresponding to a second opaque portion of the second stitching region is unexposed and is overlapping with the first portion of the photoresist.

20 Claims, 31 Drawing Sheets

United States Patent

LITHOGRAPHY

CROSS-REFERENCE TO RELATED APPLICATION

This application is a continuation application of and claims the priority benefit of prior application Ser. No. 17/461,983, filed on Aug. 30, 2021 and now allowed. The entirety of the above-mentioned patent application is hereby incorporated by reference herein and made a part of this specification.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

As merely one example, advances in lithography have enabled the formation of increasingly complex circuits. In general, lithography is the formation of a pattern on a target. In one type of lithography, referred to as photolithography, radiation such as ultraviolet light passes through or reflects off a mask before striking a photoresist coating on the target. The photoresist includes one or more components that undergo a chemical transition when exposed to radiation. A resultant change in property allows either the exposed or the unexposed portions of the photoresist to be selectively removed. In this way, photolithography transfers a pattern from the mask onto the photoresist, which is then selectively removed to reveal the pattern. The target then undergoes processing steps that take advantage of the shape of the remaining photoresist to create features on the target.

DETAILED DESCRIPTION

Figure 1A:
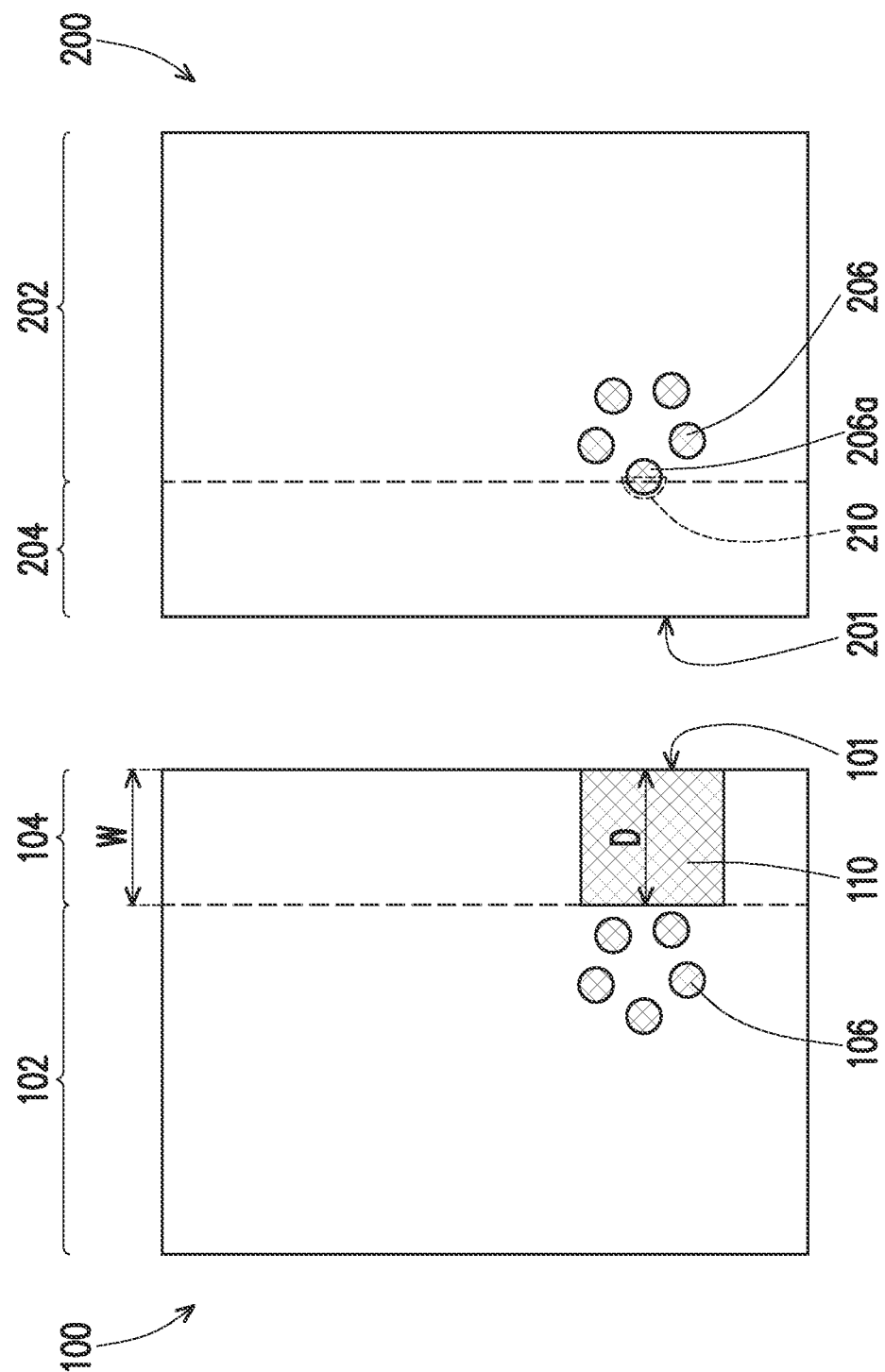
FIG. 1A shows adjacent masks according to various embodiments of the present disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Masks (i.e., photomasks) are used in many integrated circuit fabrication processes to expose a photoresist on an integrated circuit workpiece to light and, by selectively removing the exposed or unexposed regions of the photoresist, to selectively process corresponding portions of the workpiece. In order to fabricate a circuit that is larger than a given exposed area, it is required to use different masks for exposing a single photoresist at different locations. However, when performing multiple exposures with multiple masks, a stitching region which is an area where the corresponding exposure area of a first mask overlaps with the corresponding exposure area of a second mask may be exposed twice and influence the pattern transfer. In the present disclosure, the design of the mask may prevent the influence on the pattern transfer due to the stitching region.

Figure 1B:
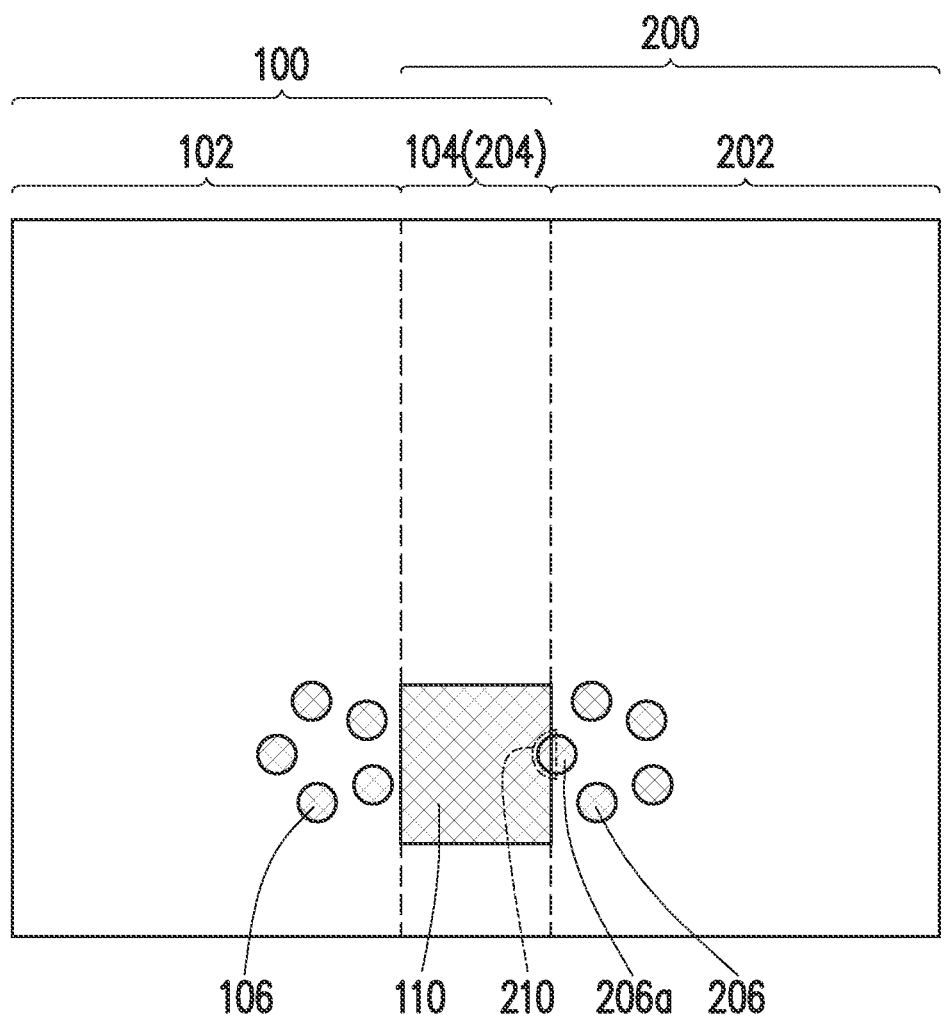
FIG. 1B shows an imaginary diagram of overlapping the stitching regions of the adjacent masks of FIG. 1A.

FIG. 1A shows adjacent masks according to various embodiments of the present disclosure, and FIG. 1B shows an imaginary diagram of overlapping the stitching regions of the adjacent masks of FIG. 1A. Referring to FIG. 1A, a first mask 100 and a second mask 200 are illustrated. In some embodiments, the first mask 100 and the second mask 200 are used in a multiple-mask multiple-exposure process where a single photoresist is exposed by more than one different mask to form a single monolithic circuit that includes circuit features formed by more than one mask. In this way, the size of the circuit is not limited by the area exposed using a single mask.

The first mask 100 includes a main die region 102 and a stitching region 104. The main die region 102 contains any number of mask features 106. The mask features 106 may be used to define functional features of an integrated circuit device (e.g., features that contribute to the operation of the integrated circuit) by either exposing or not exposing corresponding areas on the integrated circuit workpiece to light. For example, the mask features 106 define doped wells, doped active regions, device gates, contacts, interconnect lines and/or interconnect vias. In some embodiments, the mask features 106 are also referred to as functional features. In examples where the first mask 100 is a reflective mask, the mask features 106 are reflective regions disposed in a non-reflective field or non-reflective regions disposed in a reflective field. In examples where the first mask 100 is a transmissive mask, the mask features 106 are transmissive regions disposed in an absorptive field or absorptive regions disposed in a transmissive field. In FIGS. 1A and 1B, the mask features 106 are enlarged and the number of mask features 106 has been reduced for clarity because a typical first mask 100 may include billions of mask features 106. The mask features 106 in the main die region 102 may correspond to circuit features to be formed, and when forming the circuit features, the area exposed by the main die region 102 does not overlap with the exposed area of any other mask in the multiple-mask multiple-exposure process. On contrary, the stitching region 104 is an area where the corresponding exposure area overlaps with that of another mask used in the multiple-mask multiple-exposure process. The stitching region 104 may be disposed along a boundary 101 of the first mask 100. In some embodiments, the stitching region 104 is disposed at one side of the first mask 100. In alternative embodiments, the stitching region 104 is disposed at adjacent two sides of the first mask 100. In such embodiments, the stitching region 104 is L-shaped.

In alternative embodiments (not shown), the first mask 100 may further includes an alignment mark for the in-chip overlay measurement process. The alignment mark is used to align with the adjacent mask such as the second mask 200. The alignment mark may include a box pattern, a cross pattern, a parallel or abutting test line, and/or any suitable type of alignment mark. The stitching region 104 may include any number of alignment marks. Beyond the main die region 102 and the stitching region 104, the first mask 100 may include a frame area (not shown) along at least one side of the main die region 102. In alternative embodiments, the frame area is L-shaped and disposed at two adjacent sides of the main die region 102, and the stitching regions 104 are disposed at the other two sides of the main die region 102. The frame area may include scribe lines (sacrificial areas set aside for dicing the wafer), an inter-level alignment mark, and/or a fiducial feature (markings that are not part of an integrated circuit but are nonetheless a part of the mask such as logos and text). The frame area may also include a frame-area in-chip alignment mark, and the frame-area in-chip alignment mark provides additional reference points for aligning the masks of the multiple-mask multiple-exposure process.

The second mask 200 may be structured similar to the first mask 100. For example, the second mask 200 includes a main die region 202 and a stitching region 204. The second mask 200 contains any number of mask features 206, 206a. The mask features 206, 206a may be used to define functional features of an integrated circuit device (e.g., features that contribute to the operation of the integrated circuit) by either exposing or not exposing corresponding areas on the integrated circuit workpiece to light. In some embodiments, the mask features 206 are entirely disposed in the main die region 202 while the mask feature 206a is disposed in the main die region 202 and partially and/or inevitably extended into the stitching region 204. In other words, a portion of the mask feature 206a may be disposed in the stitching region 204. In some embodiments, the mask features 206, 206a define doped wells, doped active regions, device gates, contacts, interconnect lines and/or interconnect vias. In some embodiments, the mask features 206, 206a are also referred to as functional features. In the illustrated embodiments, the mask feature 206a corresponds to a large field pattern such as a large field via hole. The large field may be defined as a region having a width larger than 34 mm. In FIGS. 1A and 1B, the mask features 206, 206a are enlarged and the number of mask features 206, 206a has been reduced for clarity because a typical second mask 200 may include billions of mask features 206, 206a. The mask features 206, 206a in the main die region 202 may correspond to circuit features to be formed, and when forming the circuit features, the area exposed by the main die region 202 does not overlap with the exposed area of any other mask in the multiple-mask multiple-exposure process. On contrary, the stitching region 204 is an area where the corresponding exposure area overlaps with that of another mask used in the multiple-mask multiple-exposure process. For example, as shown in FIG. 1B, the corresponding exposure area of the stitching region 204 overlaps with that of the stitching region 104 of the first mask 100. The stitching region 204 may be disposed at disposed along a boundary 201 of the second mask 200. In some embodiments, the stitching region 204 is disposed at one side of the second mask 200. In alternative embodiments, the stitching region 204 is disposed at adjacent two sides of the second mask 200. In such embodiments, the stitching region 204 is L-shaped.

In alternative embodiments (not shown), the second mask 200 may further includes an alignment mark for the in-chip overlay measurement process. The alignment mark is used to align with the adjacent mask such as the first mask 100. The alignment mark may include a box pattern, a cross pattern, a parallel or abutting test line, and/or any suitable type of alignment mark. In some embodiments, the alignment mark has a shape similar to the alignment mark. For example, the alignment mark and the alignment mark have box patterns respectively. The stitching region 204 may include any number of alignment marks. Beyond the main die region 202 and the stitching region 204, the second mask 200 may include a frame area (not shown) along at least one side of the main die region 202. In alternative embodiments, the frame area is L-shaped and disposed at two adjacent sides of the main die region 202, and the stitching regions 204 are disposed at the other two sides of the main die region 202. The frame area may include scribe lines (sacrificial areas set aside for dicing the wafer), an inter-level alignment mark, and/or a fiducial feature (markings that are not part of an integrated circuit but are nonetheless a part of the mask such as logos and text). The frame area may also include a frame-area in-chip alignment mark, and the frame-area in-chip alignment mark provides additional reference points for aligning the masks of the multiple-mask multiple-exposure process.

As mentioned before, the stitching region is an area where the corresponding exposure areas of the adjacent masks overlap. In other words, the photoresist corresponding to the stitching region may be exposed twice. Accordingly, the mask feature in the stitching region of the mask may be not entirely transferred onto the photoresist. In some embodiments, as shown in FIGS. 1A and 1B, the first mask 100 includes an opaque region 110 (e.g., the mesh pattern in FIGS. 1A and 1B is meant to represent an opaque region of the mask, and the white color in FIGS. 1A and 1B is meant to represent a transparent region of the mask) within the stitching region 104, and the opaque region 110 corresponds to the mask feature 206a in the stitching region 204 of the second mask 200. For example, as shown in FIGS. 1A and 1B, the mask feature 206a of the second mask 200 is an opaque pattern and includes an opaque region 210 in the stitching region 204, and the opaque region 110 fully overlaps with the opaque region 210. In some embodiments, a total area of the opaque region 110 is larger than a total area of the opaque region 210. Accordingly, the corresponding unexposed region of the opaque region 110 in the stitching region 104 of the first mask 100 fully overlaps with the corresponding unexposed region of the opaque region 210 of the mask feature 206a in the stitching region 204 of the second mask 200. Therefore, the unexposed portion of the photoresist during the first lithographic exposure with the first mask 100 remains unexposed after the second lithographic exposure with the second mask 200. Thus, the mask feature 206a may be entirely transferred onto the photoresist on the integrated circuit workpiece.

The mask feature 206a in the stitching region 204 of the second mask 200 may be a mask feature that is disposed at the edge of the main die region 202 and partially and/or inevitably extended into the stitching region 204. The mask feature 206a in the stitching region 204 of the second mask 200 corresponds to a large field via hole, for example. In some embodiments, the opaque region 110 is extended toward the main die region 102 from the boundary 101 by a width D. For example, the width D is substantially equal to a total width W of the stitching region 104. In alternative embodiments, the width D is smaller than the total width W of the stitching region 104. In addition, the opaque region 110 is illustrated as a rectangular shape, however in alternative embodiments, the opaque region 110 has any suitable shape as long as the corresponding unexposed region of the opaque region 110 fully overlapping with the corresponding unexposed region of the mask feature 206a in the stitching region 204 of the second mask 200. For example, the opaque region 110 has a shape of a circle, a triangle, a rectangle, a polygon or a regular polygon such as a square and a regular hexagon. In various examples, the second mask 200 includes one or more mask features 206a extended into the stitching region 204. In that regard, the stitching region 104 may include any number of opaque regions 110. In some embodiments, the opaque region 110 is separately from the mask features 106.

Figure 2A:
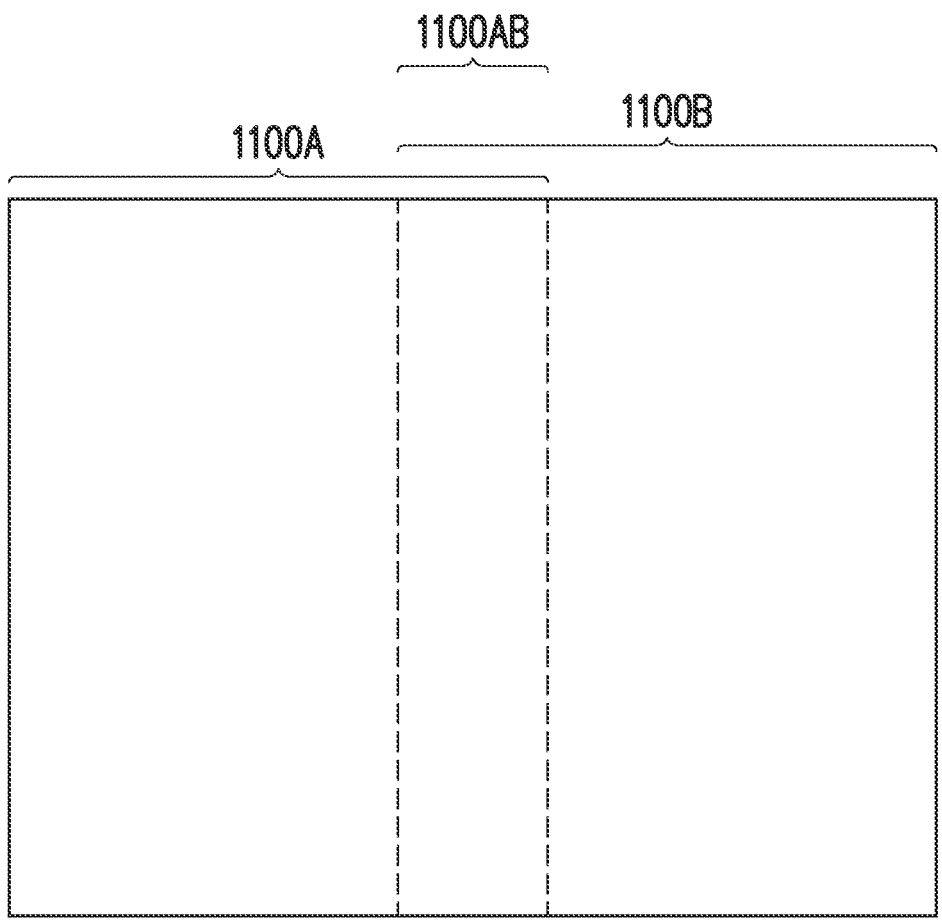
FIGS. 2A-2E are top view diagrams of portions of an integrated circuit workpiece undergoing a method of multiple-mask multiple-exposure patterning according to various embodiments of the present disclosure.

A method for performing photolithography using the first mask 100 and the second mask 200 such as those as described above is described with reference to FIGS. 2A-2E. FIGS. 2A-2E are top view diagrams of portions of an integrated circuit workpiece undergoing a method of multiple-mask multiple-exposure patterning according to various embodiments of the present disclosure. FIG. 3A is a cross-sectional diagram of the integrated circuit workpiece along a line I-I' of FIG. 2A, FIG. 3B is a cross-sectional diagram of the integrated circuit workpiece along a line I-I' of FIG. 2D, and FIG. 3C is a cross-sectional diagram of the integrated circuit workpiece along a line I-I' of FIG. 2E.

Referring to FIGS. 2A and 3A, an integrated circuit workpiece 1000 is provided. The workpiece 1000 includes a substrate 1002 upon which other layers and features are formed. In various examples, the substrate 1002 includes an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, and/or calcium fluoride ($CaF_2$); and/or combinations thereof. The workpiece 1000 includes a first region 1100A and a second region 1100B, for example. An overlap region 1100AB is disposed between the first region 1100A and the second region 1100B, and includes overlapping portions of the first region 1100A and the second region 1100B. The overlap region 1100AB may be referred to as a stitching zone. In an embodiment, the overlap region 1100AB is a strip, which may have a uniform width. Additionally, the first region 1100A and the second region 1100B may have a substantially same size; although in other embodiments, their size or shape may be different from each other.

In some embodiments, the workpiece 1000 has a combined length L across the first region 1100A and the second region 1100B of more than about 26 mm. In other embodiments, the workpiece 1000 has a combined length L across the first region 1100A and the second region 1100B of more than about 33 mm.

The workpiece 1000 may include a plurality of groupings of regions substantially identical to the grouping of regions 1100A and 1100B, where the plurality of groupings of regions may form an array of dies. Each grouping of regions 1100A and 1100B is used to provide a large chip area in a single die. In alternative embodiments (not shown), the workpiece 1000 further includes a third region below the first region and a fourth region below the second region, an overlap region between the first region and the third region, an overlap region between the second region and the fourth region and an overlap region between the third region and the fourth region.

The substrate 1002 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 1002. In some such examples, a layer of the substrate 1002 may include an insulator such as a semiconductor oxide, a semiconductor nitride, a semiconductor oxynitride, a semiconductor carbide, and/or other suitable insulator materials.

In some examples, the workpiece 1000 includes a material layer 1004 disposed on the substrate 1002. In some such examples, the material layer 1004 includes a dielectric layer, and suitable materials for the dielectric of the material layer 1004 include semiconductor oxides, semiconductor nitrides, semiconductor oxynitrides, semiconductor carbides, and/or other suitable materials. In an example, the material layer 1004 is a hard mask dielectric layer. In some examples, the material layer 1004 includes a semiconductor layer such as a silicon layer, or germanium layer, a silicon germanium layer, and/or other suitable semiconductor layers. The workpiece 1000 may further include a photoresist 1006 disposed on top of the material layer 1004. Portions of the photoresist 1006 that are exposed to the radiation undergo a chemical transition making them either more or less sensitive to a developing process. The photoresist 1006 may be a negative photoresist or a positive photoresist.

Figure 2B:
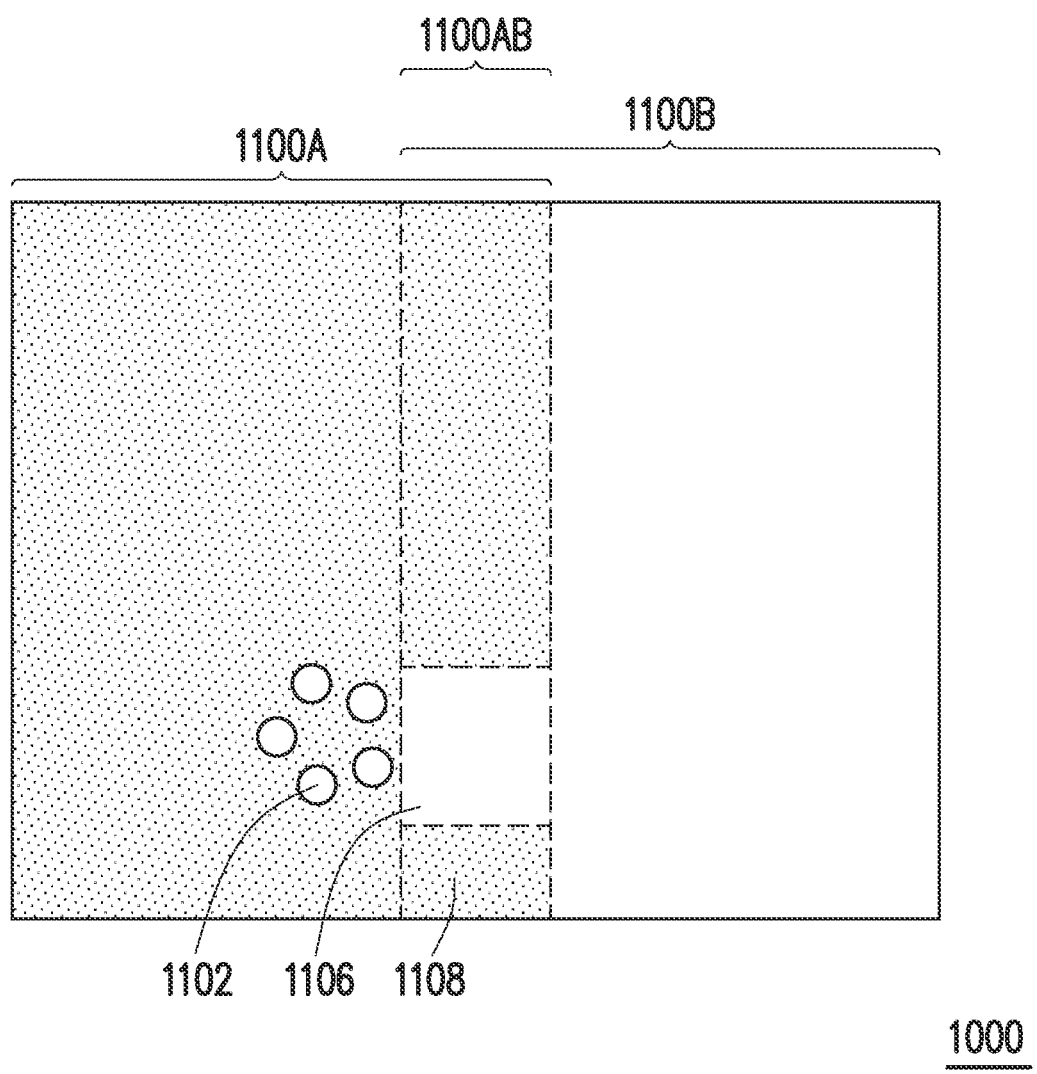
Figure 3A:
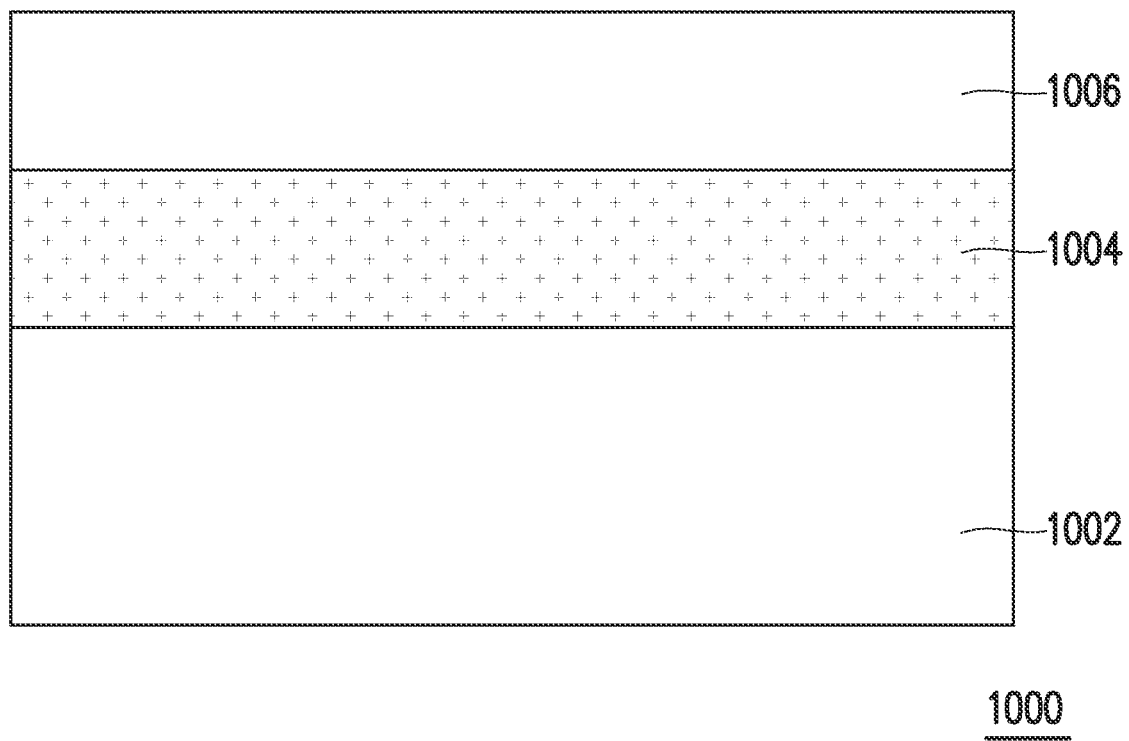
FIG. 3A is a cross-sectional diagram of the integrated circuit workpiece along a line I-I' of FIG. 2A.
Figure 3B:
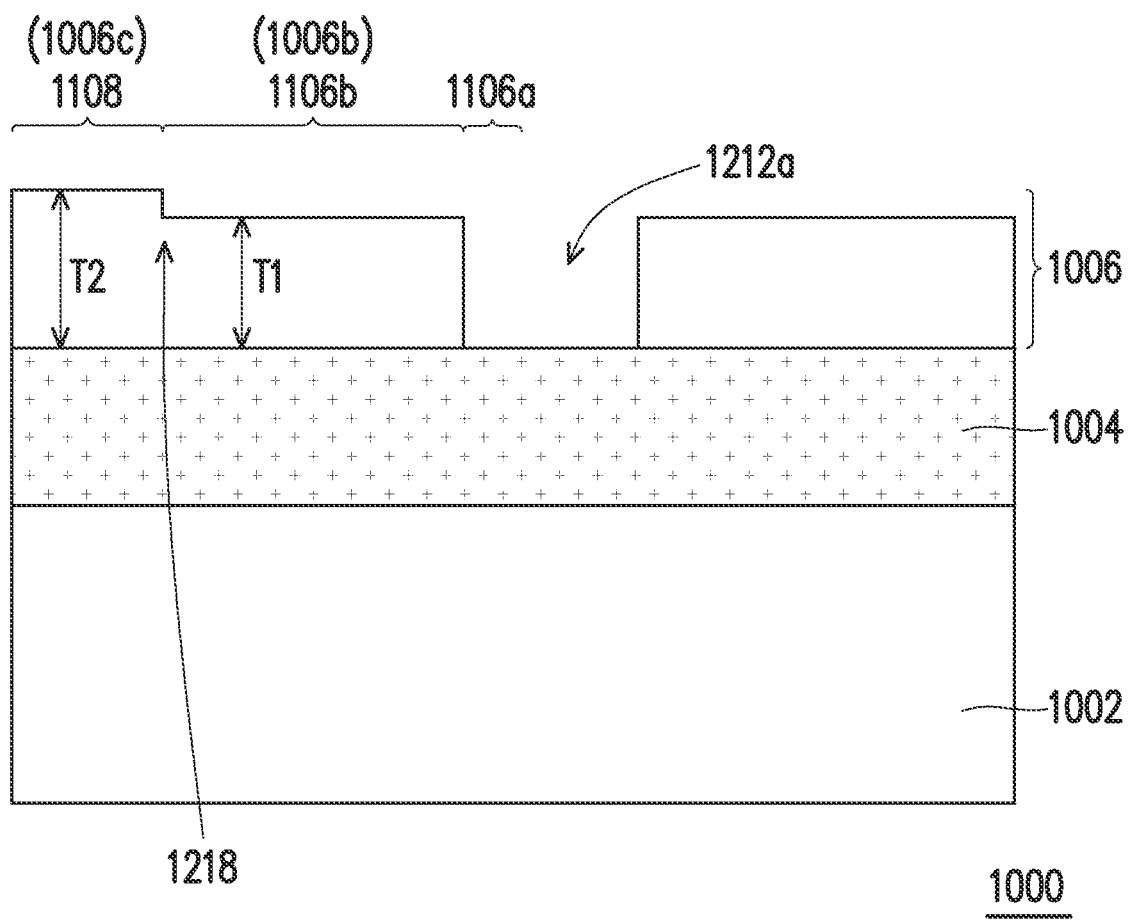
FIG. 3B is a cross-sectional diagram of the integrated circuit workpiece along a line I-I' of FIG. 2D.
Figure 3C:
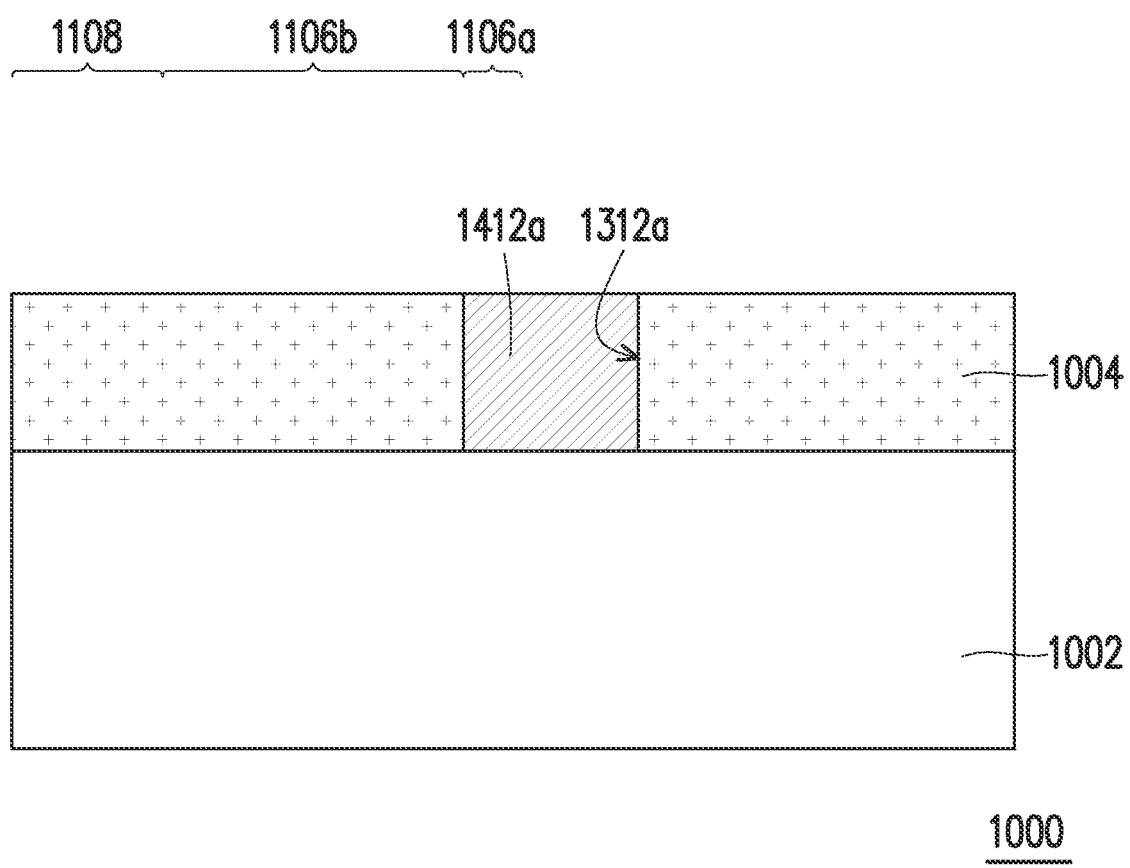
FIG. 3C is a cross-sectional diagram of the integrated circuit workpiece along a line I-I' of FIG. 2E.

Referring to FIG. 2B, a first lithographic exposure is performed on the first region 1100A of the photoresist 1006 using the first mask 100. The first mask 100 is placed so as to expose (e.g., directly over) the first region 1100A (including the overlap region 1100AB). The first mask 100, limited by the maximum size of its reticle field, is not large enough to cover both the first region 1100A and the second region 1100B. Rather, the first lithographic exposure is used to expose portions of the photoresist 1006 in the first region 1100A and the overlap region 1100AB, but not the second region 1100B.

The first lithographic exposure may expose the first region 1100A according to the mask features 106 present in the first mask 100. Herein, exposed regions of the photoresist 1006 are shaded while unexposed regions are remained white for clarity. In the illustrated embodiments, regions of the photoresist 1006 corresponding to the mask features 106 of the first mask 100 are indicated by patterns 1102. In some embodiments, the overlap region 1100AB corresponds to the stitching region 104 of the first mask 100. In some embodiments, the overlap region 1100AB includes a region 1106 corresponding to the opaque region 110 of the first mask 100 and a region 1108 aside the region 1106. The region 1106 is an unexposed region.

Figure 2C:
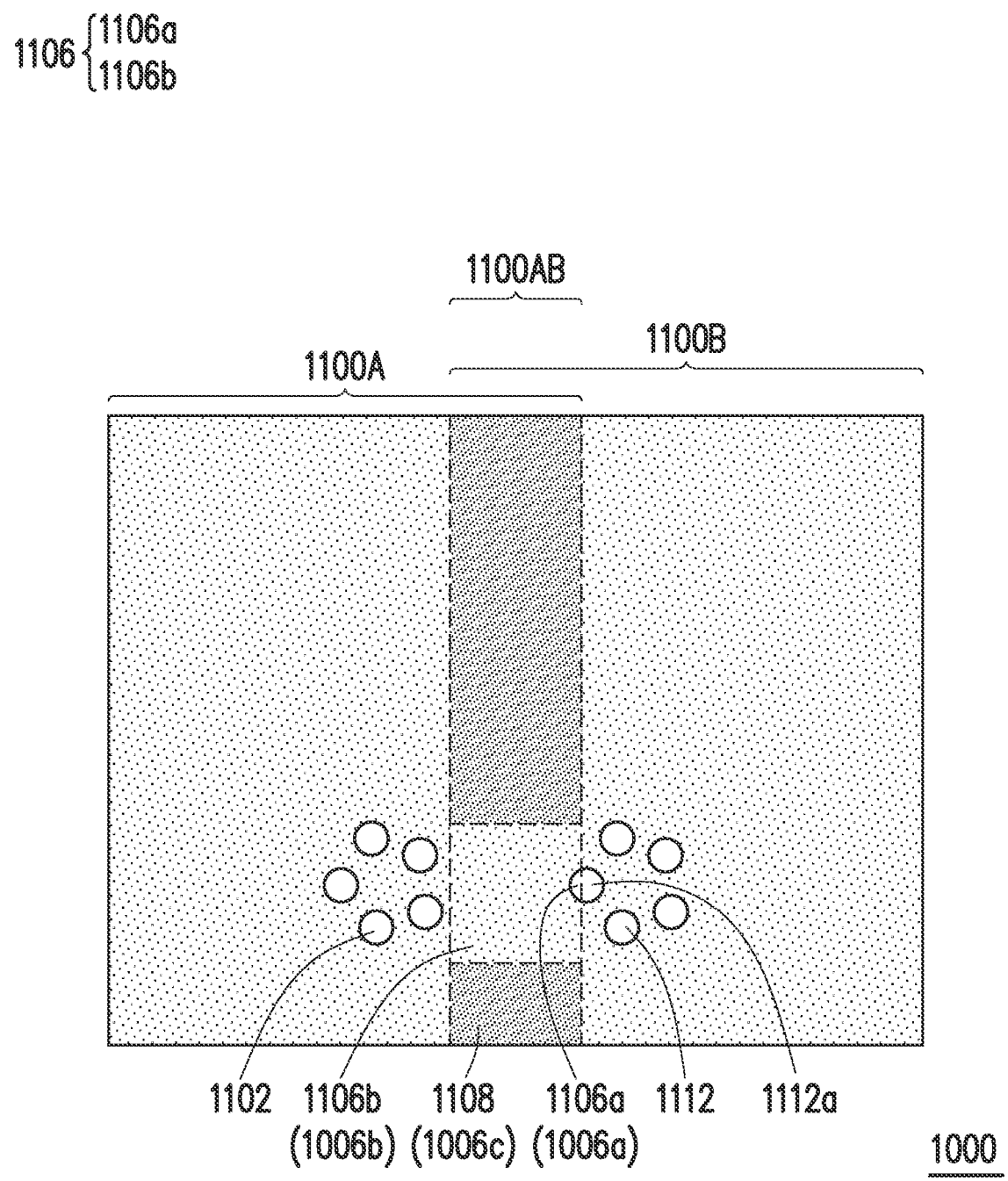
Figure 2D:
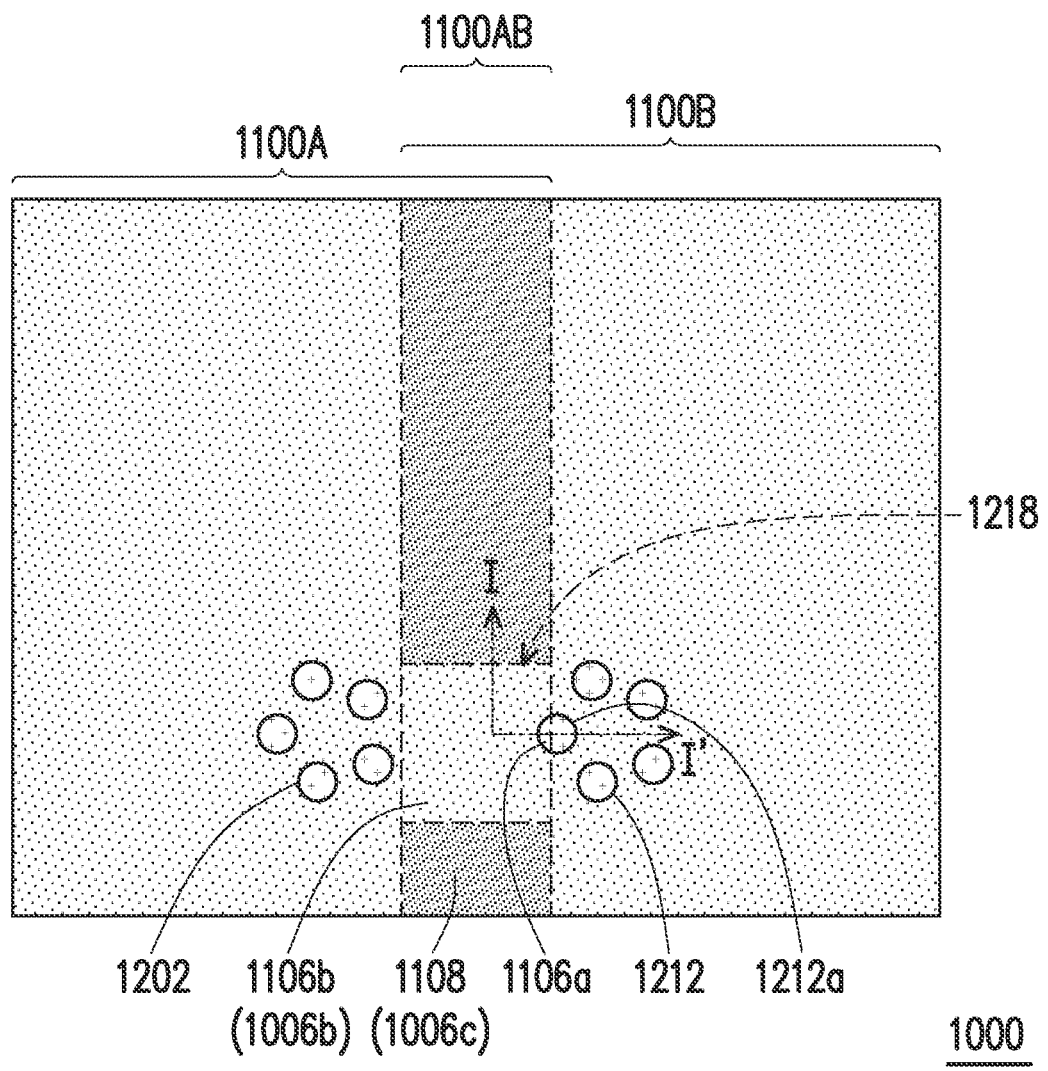

Referring to FIG. 2C, a second lithographic exposure is performed on the second region 1100B of the photoresist 1006 using the second mask 200. The second mask 200 is placed so as to expose (e.g., directly over) the second region 1100B (including the overlap region 1100AB). The second mask 200, limited by the maximum size of its reticle field, is not large enough to cover both the second region 1100B and the first region 1100A. Rather, the second lithographic exposure is used to expose portions of the photoresist 1006 in the second region 1100B and the overlap region 1100AB, but not the first region 1100A.

As with the first lithographic exposure, the second lithographic exposure may pattern the photoresist 1006 according to the mask features 206, 206a present in the second mask 200. In the illustrated embodiments, regions of the photoresist 1006 corresponding to the mask feature 206, 206a are indicated by patterns 1112, 1112a. In some embodiments, the overlap region 1100AB corresponds to the stitching region 204 of the second mask 200. The pattern 1112a is partially formed in the region 1106 of the overlap region 1100AB. In the illustrated embodiments, the region 1106 includes a region 1106a and a region 1106b, and the region 1106a corresponds to the opaque region 210 of the second mask 200. During the second lithographic exposure, the photoresist 1006 in the region 1106a is unexposed while the photoresist 1006 in the region 1106b is exposed. In some embodiments, the photoresist 1006 in the region 1106 is unexposed during the first lithographic exposure due to the opaque region 110 of the first mask 100, and the photoresist 1006 in the region 1106a of the region 1106 is still unexposed during the second lithographic exposure due to the opaque region 210 of the second mask 200. Accordingly, the photoresist 1006 in the region 1106a remains unexposed after the first and second lithographic exposures. For example, the photoresist 1006 in the overlap region 1100AB includes an unexposed portion 1006a in the region 1106a (i.e., shown in white color) after the first and second lithographic exposures, a portion 1006b in the region 1106b (i.e., shown in light color) exposed once by the second lithographic exposure and a portion 1006c in the region 1108 (i.e., shown in dark color) exposed twice by the first and second lithographic exposures. In the illustrated embodiments, a portion of the pattern 1112a in the region 1106a of the overlap region 1100AB remains unexposed as the other portion of the pattern 1112a in the second region 1100B. Accordingly, the pattern 1112a is entirely transferred onto the photoresist 1006. In other words, by the design of the first mask 100 and the second mask 200, the desired pattern is completely transferred onto the photoresist 1006.

Referring to FIGS. 2D and 3B, after the first and second lithographic exposures, the photoresist 1006 is developed. The developing process may leave only those portions of the photoresist 1006 that were exposed or may leave only those portions of the photoresist layer that were not exposed. In the case of using the negative photoresist as the photoresist 1006, the unexposed portions of the photoresist 1006 may be entirely removed. For example, the patterns 1102, 1112, 1112a are removed to form patterns 1202, 1212, 1212a in the photoresist 1006 respectively. In the illustrated embodiments, the patterns 1202, 1212, 1212a are via holes and expose portions of the material layer 1004. However, in alternative embodiments, the patterns 1202, 1212, 1212a are any suitable patterns, and the patterns 1202, 1212, 1212a may be different. In addition, since the extent of the exposure of the portion 1006b and the portion 1006c of the photoresist 1006 is different, the remained amount of the portion 1006b may be different from the remained amount of the portion 1006c. In the illustrated embodiments, the remained amount of the exposed portion 1006b is less than the remained amount of the remained amount of the exposed portion 1006c. For example, as shown in FIG. 3B, a thickness T1 of the exposed region 1106b is smaller than a thickness T2 of the exposed portion 1106c. The thickness difference between the exposed region 1106b and the exposed portion 1106c may be in a range of 0-3 µm. As shown in FIGS. 2D and 3B, due to the thickness difference, a mark 1218 may be seen between the exposed region 1106b and the exposed portion 1106c. In some embodiments, since the thickness difference may be small with respect to the thickness of the exposed region 1106b and the exposed portion 1106c, the mark 1218 is light.

Figure 2E:
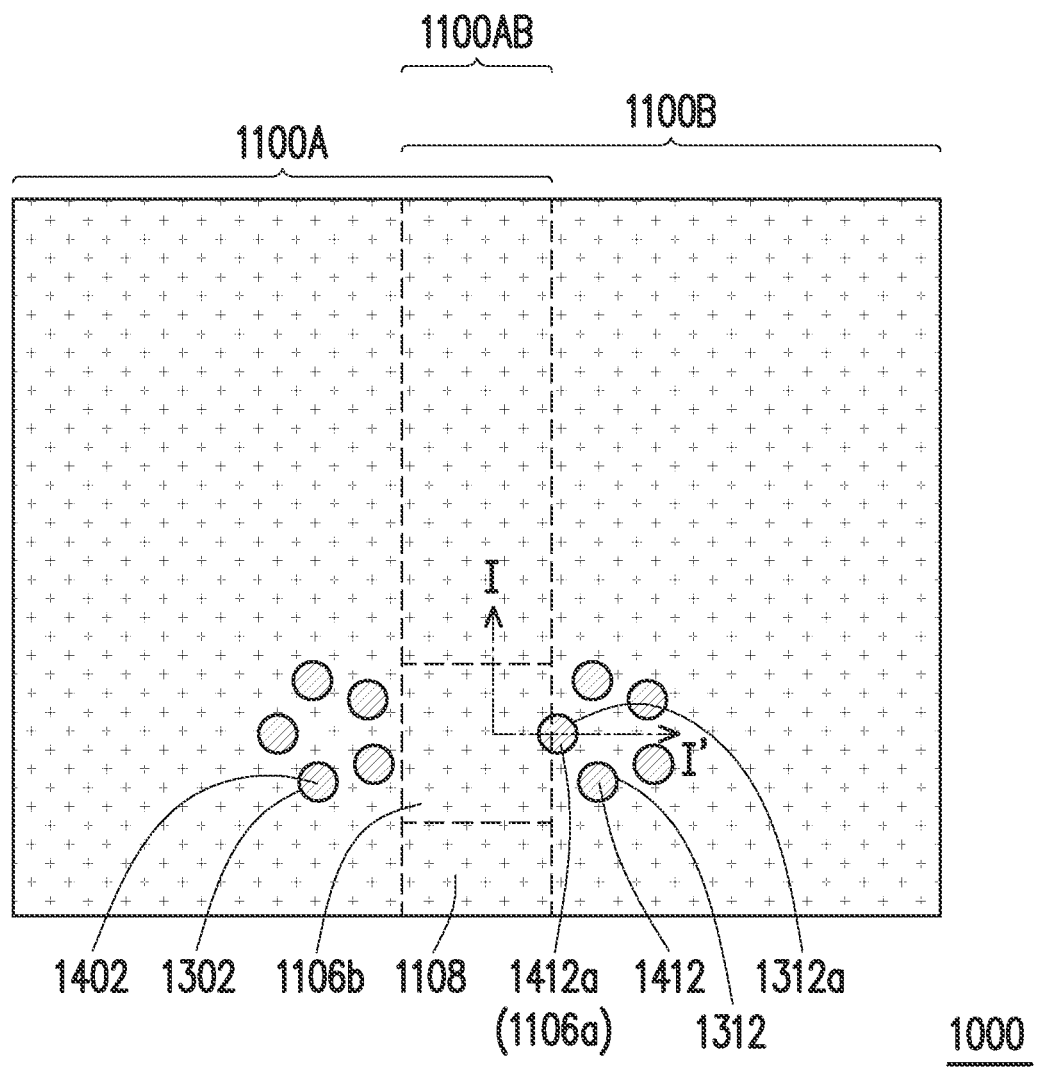

Referring to FIGS. 2E and 3C, the patterned photoresist 1006 is used to selectively process exposed portions of the material layer 1004, and then the patterned photoresist 1006 is removed. In some examples, this includes etching the exposed portion of the material layer 1004 to expose the substrate 1002 underneath. In further examples, processing the exposed portions of the material layer 1004 includes doping the material layer 1004, depositing another material upon the material layer 1004, epitaxially growing material upon the material layer 1004, and/or other suitable circuit fabrication processes. In the illustrated embodiments, the exposed portions of the material layer 1004 are etched to form patterns 1302, 1312, 1312a. The patterns 1302, 1312, 1312a may be via holes having a diameter larger than 3 µm, for example. In alternative embodiments, the patterns 1302, 1312, 1312a are any suitable patterns, and the patterns 1302, 1312, 1312a may be different. In some embodiments, a thickness of the patterned material layer 1004 in different regions may be substantially the same.

In some embodiments, after forming the patterns 1302, 1312, 1312a, patterns 1402, 1412, 1412a such as vias are formed in the patterns 1302, 1312, 1312a respectively. The patterns 1402, 1412, 1412a may be vias having a diameter larger than 3 μm, and the patterns 1402, 1412, 1412a may be formed by a single damascene process or any suitable method. In alternative embodiments, the patterns 1402, 1412, 1412a are any suitable patterns, and the patterns 1402, 1412, 1412a may be different.

In some embodiments, the first region 1100A of the photoresist 1006 exposed by the mask features 106 of the first mask 100 and the second region 1100B exposed by the mask features 206, 206a of the second mask 200 form circuit features for a single monolithic integrated circuit. In some embodiments, the second lithographic exposure with the second mask is performed after the first lithographic exposure with the first mask. However, the disclosure is not limited thereto. The first lithographic exposure with the first mask may be performed after the second lithographic exposure with the second mask. In addition, the processes above may be repeated for as many masks and as many exposures are used to pattern the workpiece 1000.

Figure 4A:
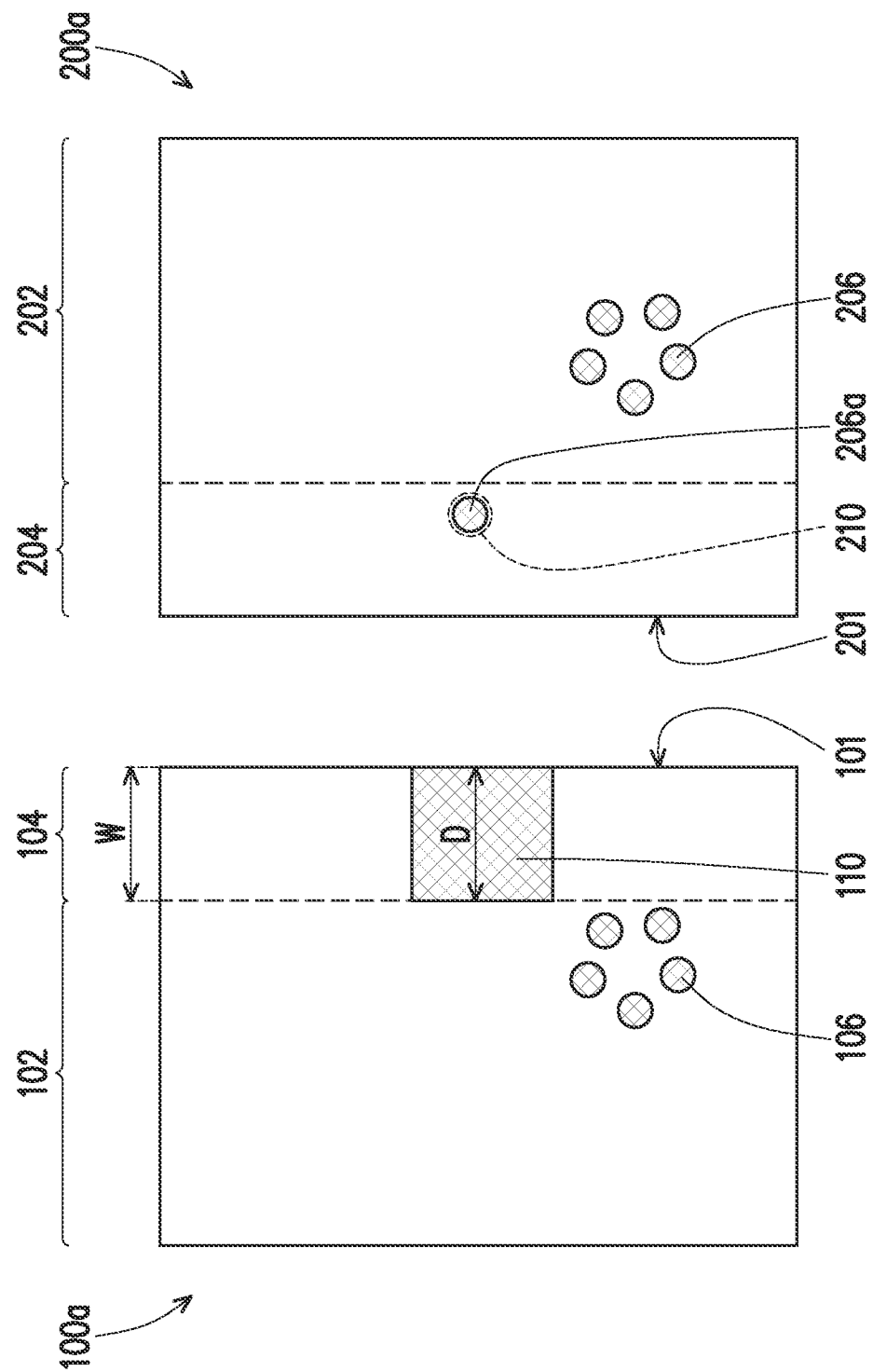
FIG. 4A shows portions of adjacent masks according to various embodiments of the present disclosure.
Figure 4B:
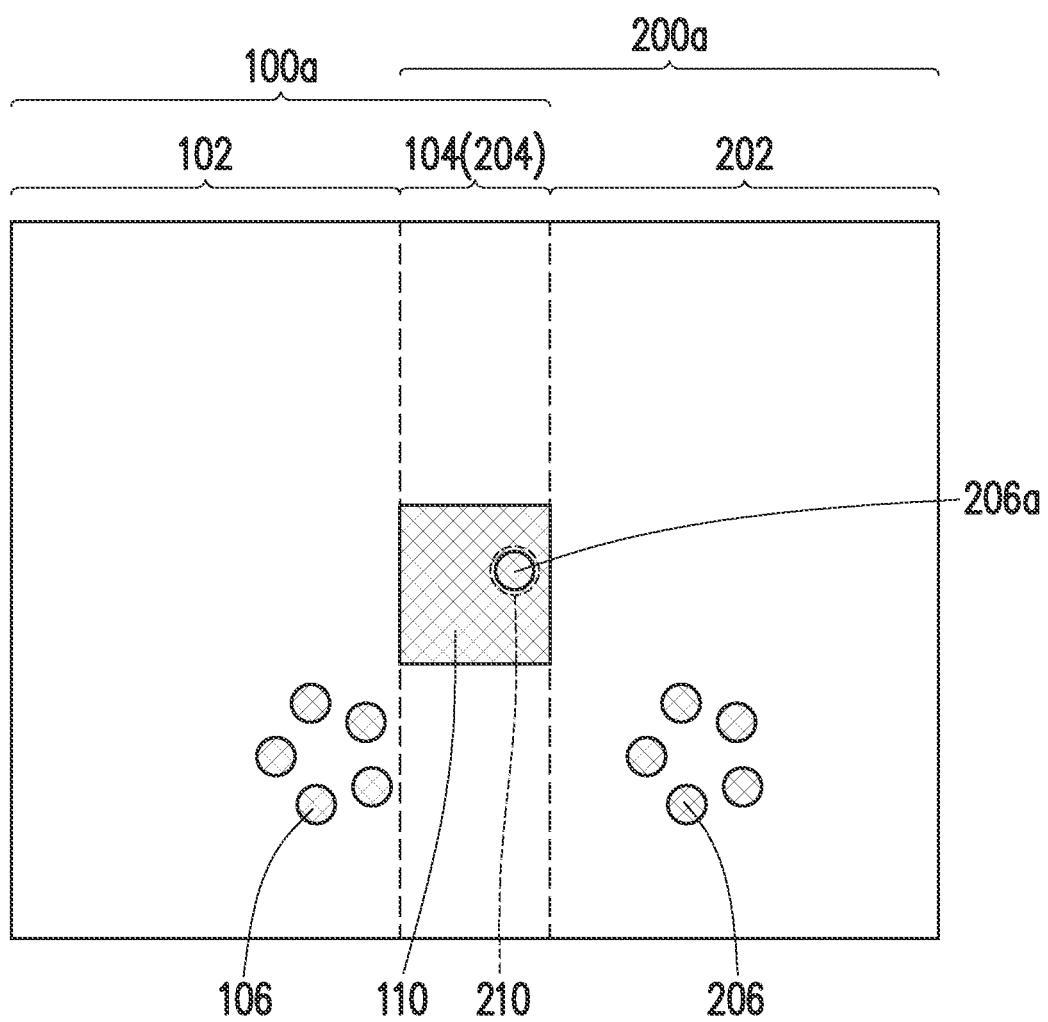
FIG. 4B shows an imaginary diagram of overlapping the stitching regions of the adjacent masks of FIG. 4A.

FIG. 4A shows portions of adjacent masks according to various embodiments of the present disclosure, and FIG. 4B shows an imaginary diagram of overlapping the stitching regions of the adjacent masks of FIG. 4A. The first mask 100a and the second mask 200a are similar to the first mask 100 and the second mask 200 respectively, and the main difference lies in the mask feature 206a is entirely disposed in the stitching region 204. In some embodiments, as shown in FIGS. 4A and 4B, the corresponding unexposed area of the opaque region 110 in the stitching region 104 of the first mask 100a fully overlaps with the corresponding exposure area of the mask feature 206a in the stitching region 204 of the second mask 200a. A total area of the opaque region 110 may be larger than a total area of the corresponding mask feature 206a.

Figure 5A:
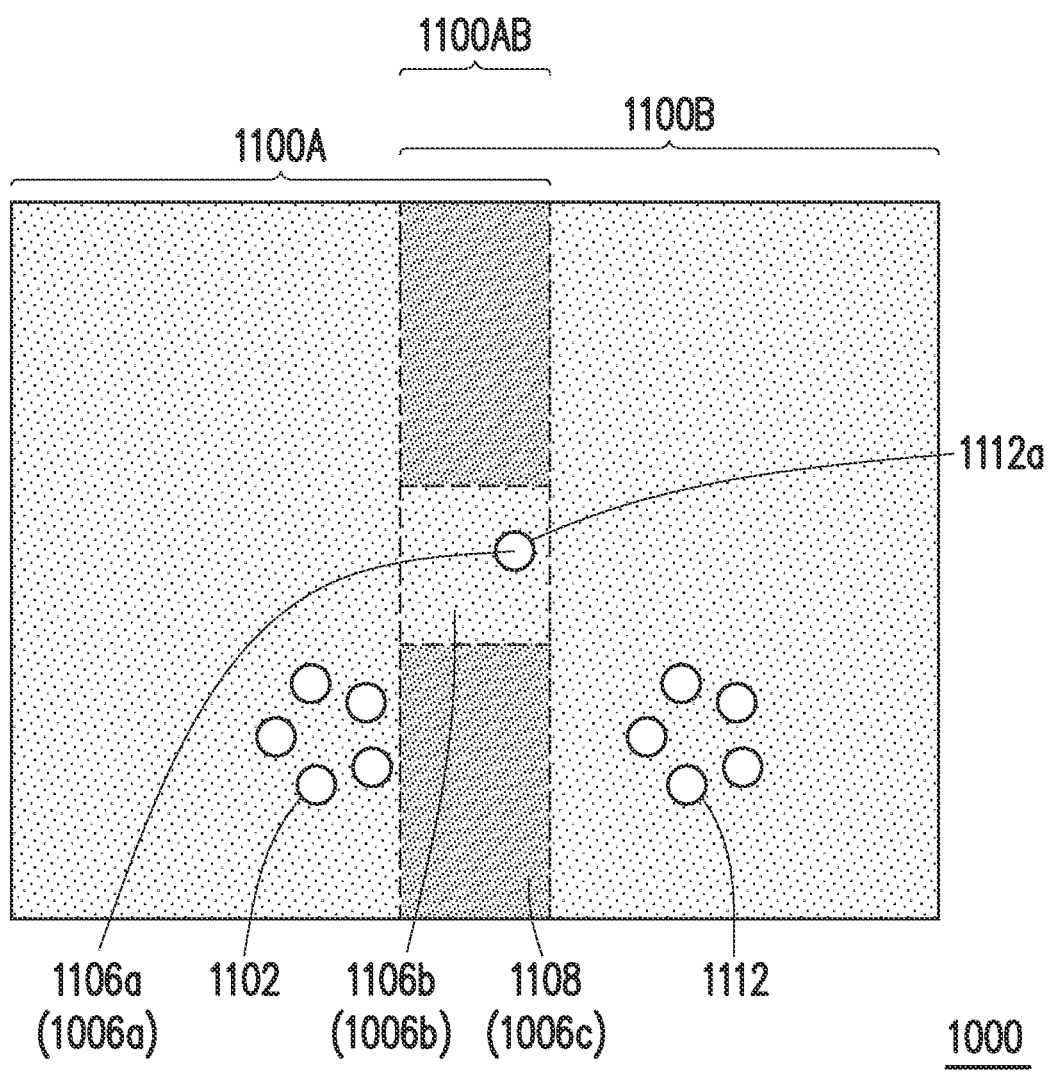
FIGS. 5A to 5C are top view diagrams of an integrated circuit workpiece undergoing a method of multiple-mask multiple-exposure patterning according to various embodiments of the present disclosure.
Figure 5B:
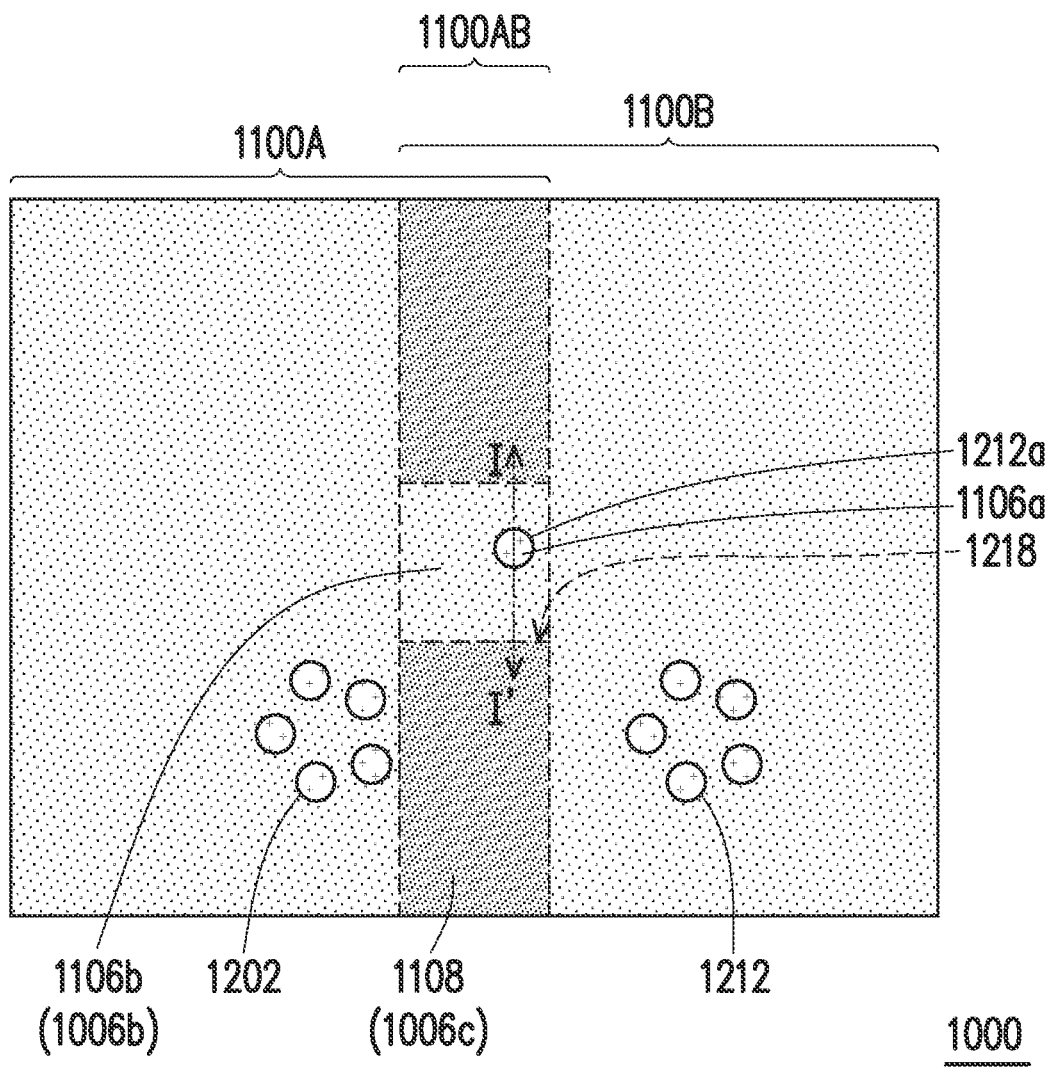
Figure 5C:
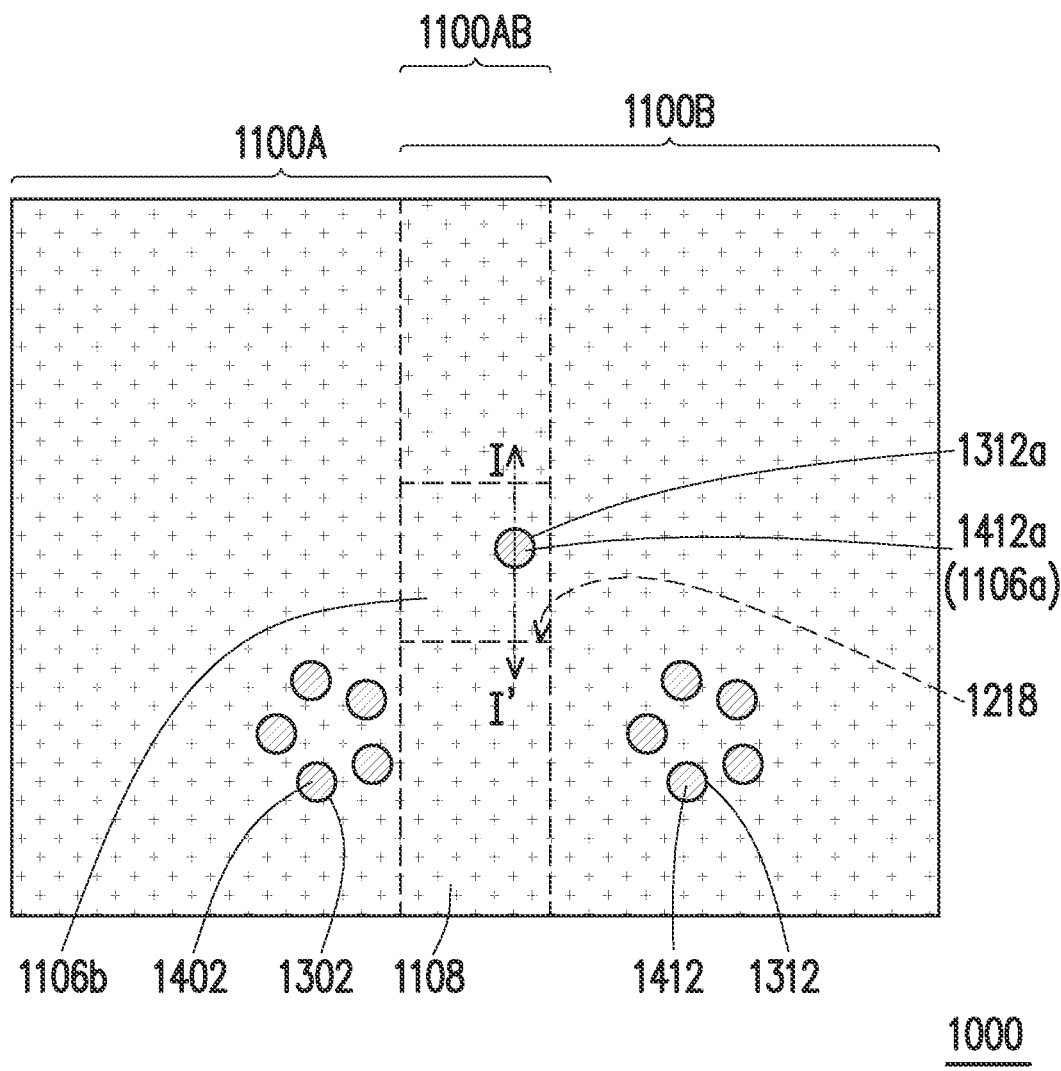
Figure 6A:
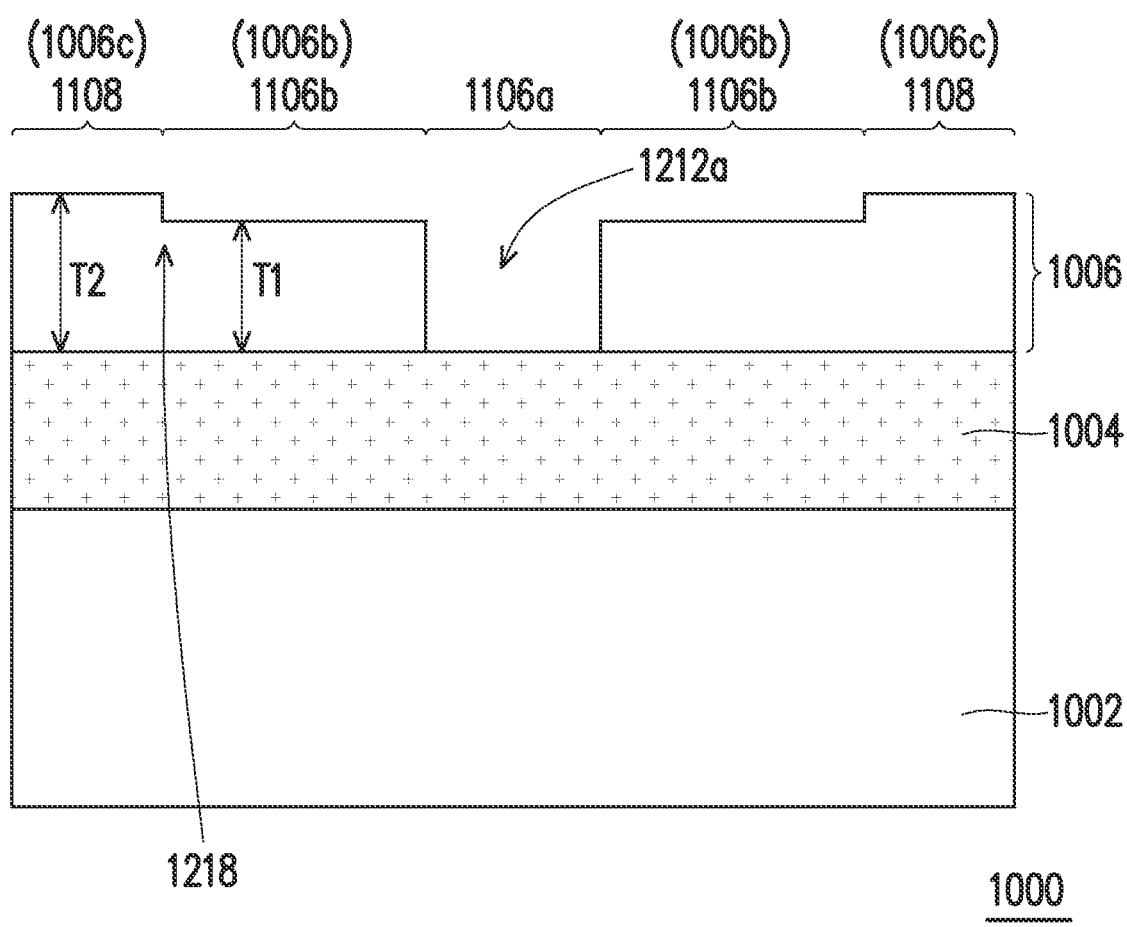
FIGS. 6A and 6B are cross-sectional diagrams of the integrated circuit workpiece along a line I-I' of FIGS. 5B and 5C.
Figure 6B:
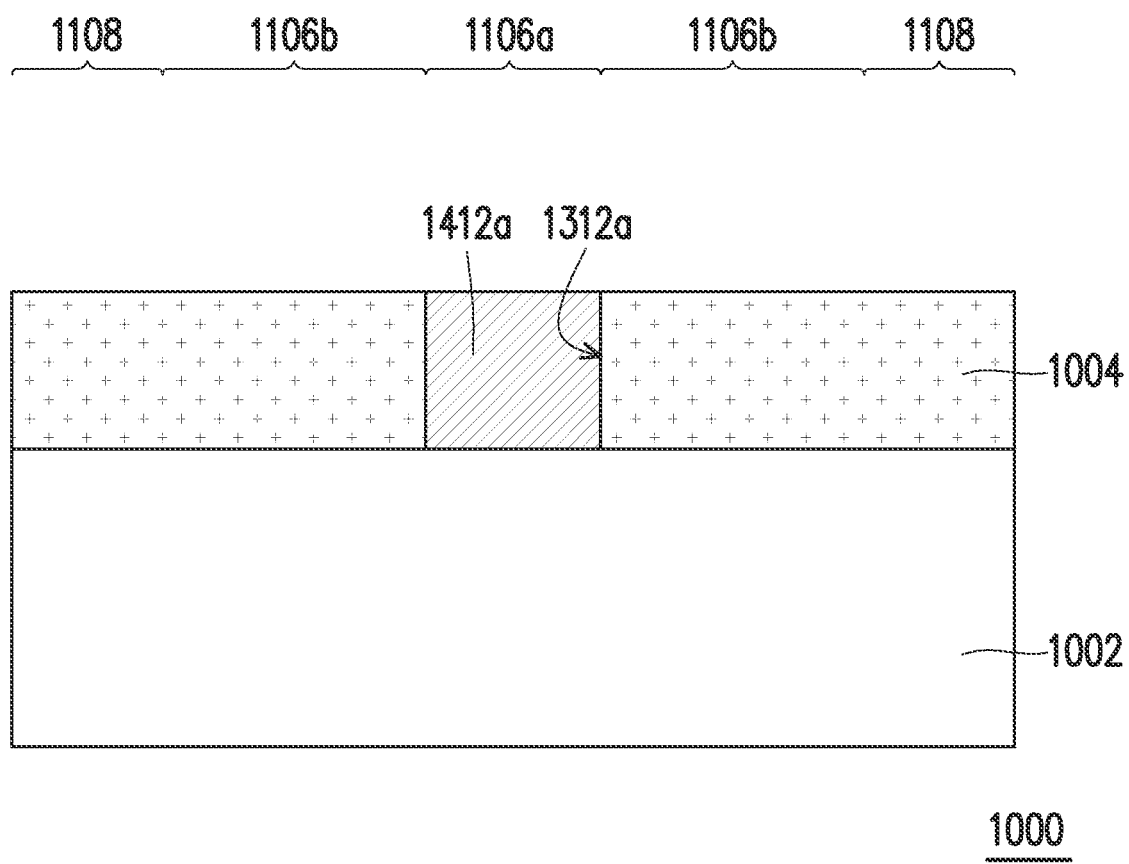

FIGS. 5A to 5C are top view diagrams of an integrated circuit workpiece undergoing a method of multiple-mask multiple-exposure patterning according to various embodiments of the present disclosure. FIGS. 6A and 6B are cross-sectional diagrams of the integrated circuit workpiece along a line I-I' of FIGS. 5B and 5C. The patterning method is similar to the patterning method of FIGS. 2A-2E and 3A-3C, and the main difference lies in using the first mask 100a and the second mask 200a. Referring to FIG. 5A, the photoresist 1006 is exposed by the first and second lithographic exposures with the first and second masks 100a and 200a. In some embodiments, the photoresist 1006 includes an unexposed portion 1006a in the region 1106a during the first and second lithographic exposures, a portion 1006b in the region 1106b exposed once by the second lithographic exposure and a portion 1006c in the region 1108 exposed twice by the first and second lithographic exposures. The unexposed portion 1006a, the portion 1006b and the portion 1006c are similar to those in FIG. 2C.

Referring to FIGS. 5B and 6A, the photoresist 1006 is developed. In some embodiments, patterns 1102, 1112, 1112a are removed to form patterns 1202, 1212, 1212a in the photoresist 1006 respectively. The pattern 1202, 1212, 1212a and the portion 1006b and the portion 1006c are similar to those in FIGS. 2D and 3B. For example, a thickness T1 of the portion 1006b is smaller than a thickness T2 of the portion 1006c, and a mark 1218 is formed between the region 1106b and the region 1108. In such embodiments, the mask feature 206a may be entirely transferred onto the photoresist 1006 on the integrated circuit workpiece 1000.

Referring to FIGS. 5C and 6B, the patterned photoresist 1006 is used to selectively process exposed portions of the material layer 1004, and then the patterned photoresist 1006 is removed. In the illustrated embodiments, the exposed portions of the material layer 1004 are etched to form patterns 1302, 1312, 1312a, and then patterns 1402, 1412, 1412a are formed in the patterns 1302, 1312, 1312a respectively. The patterns 1302, 1312, 1312a, 1402, 1412, 1412a are similar to those in FIGS. 2E and 3C.

Figure 7A:
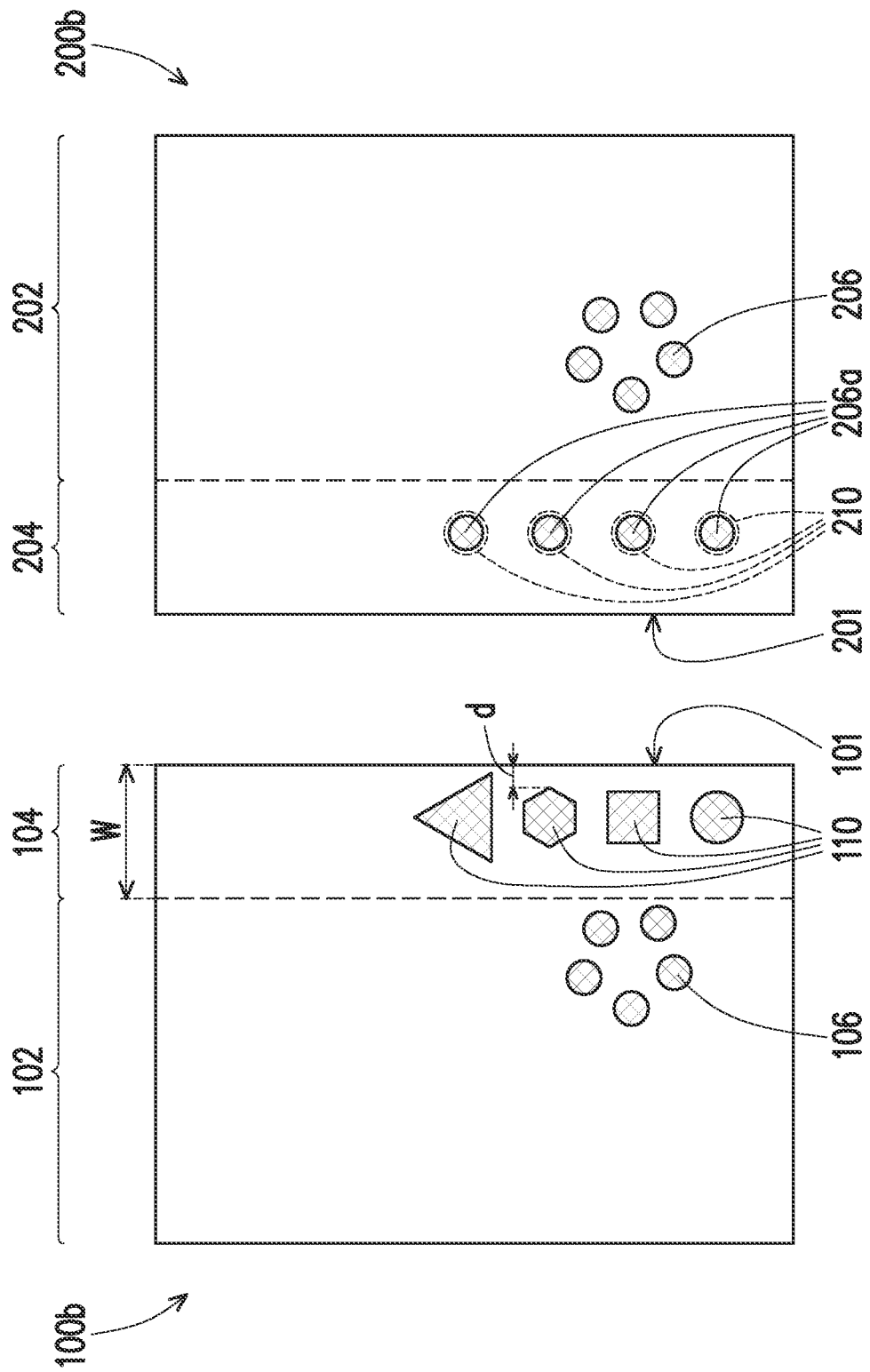
FIG. 7A shows portions of adjacent masks according to various embodiments of the present disclosure.
Figure 7B:
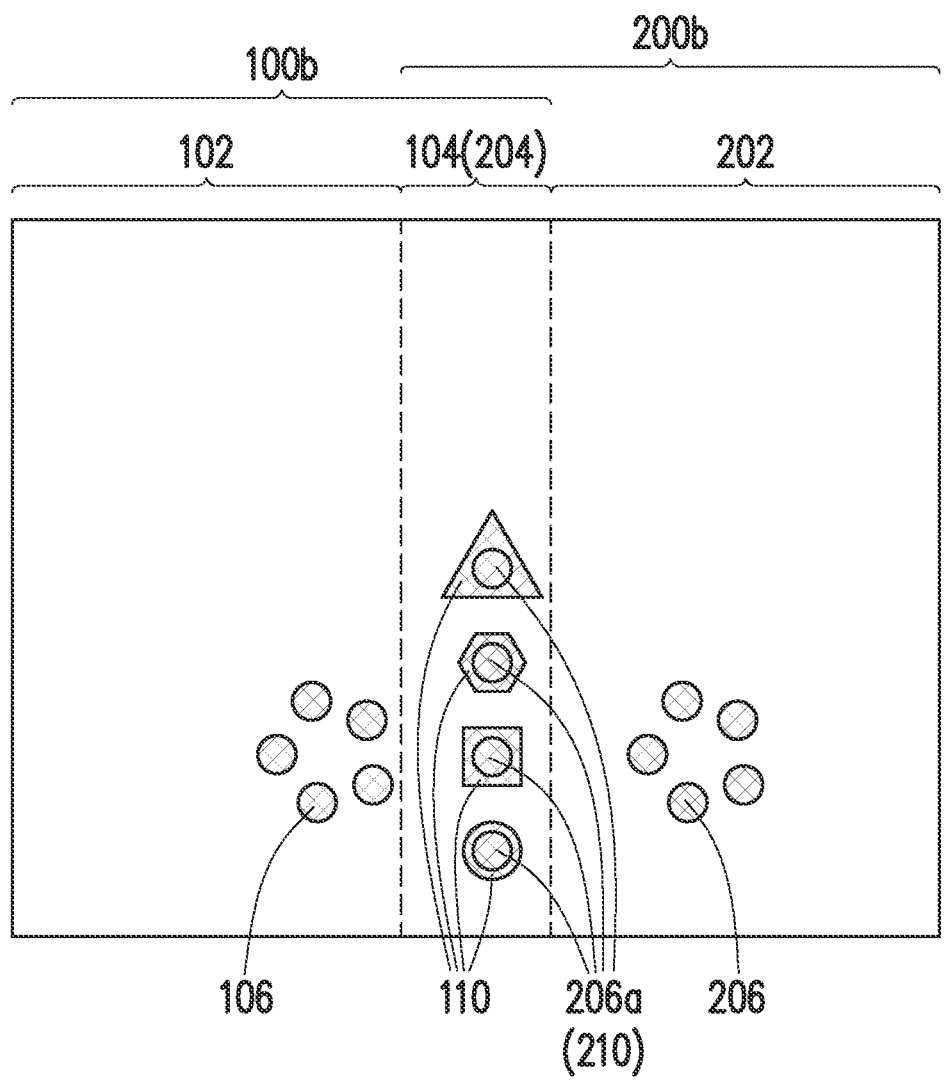
FIG. 7B shows an imaginary diagram of overlapping the stitching regions of the adjacent masks of FIG. 7A.

FIG. 7A shows portions of adjacent masks according to various embodiments of the present disclosure, and FIG. 7B shows an imaginary diagram of overlapping the stitching regions of the adjacent masks of FIG. 7A. The first mask 100b and the second mask 200b are similar to the first mask 100 and the second mask 200 respectively, and the main difference lies in the configuration of the opaque region 110. In some embodiments, as shown in FIGS. 7A and 7B, the first mask 100b includes a plurality of opaque regions 110 in the stitching region 204, and the second mask 200b includes a plurality of mask feature 206a in the stitching region 204.

In some embodiments, the opaque region 110 is not extended from the boundary 201 of the first mask 100b, that is, a distance d is formed between an edge of the opaque region 110 and the boundary 101. The opaque region 110 may be of an enclosed shape, such as a circle, a polygon (e.g., a triangle and a rectangle), a regular polygon (e.g., a regular triangle, a square and a regular hexagon) or any suitable shape. As shown in FIG. 7B, the corresponding unexposed areas of the opaque regions 110 in the stitching region 104 of the first mask 100a fully overlap with the corresponding exposure areas of the mask features 206a in the stitching region 204 of the second mask 200a, respectively. For example, when the mask feature 206a of the second mask 200 includes an opaque region 210 in the stitching region 204, the opaque region 110 fully overlaps with the opaque region 210, and a total area of the opaque region 110 is larger than a total area of the opaque region 210. By this configuration, the mask feature 206a may be entirely transferred onto the photoresist on the integrated circuit workpiece.

Figure 8A:
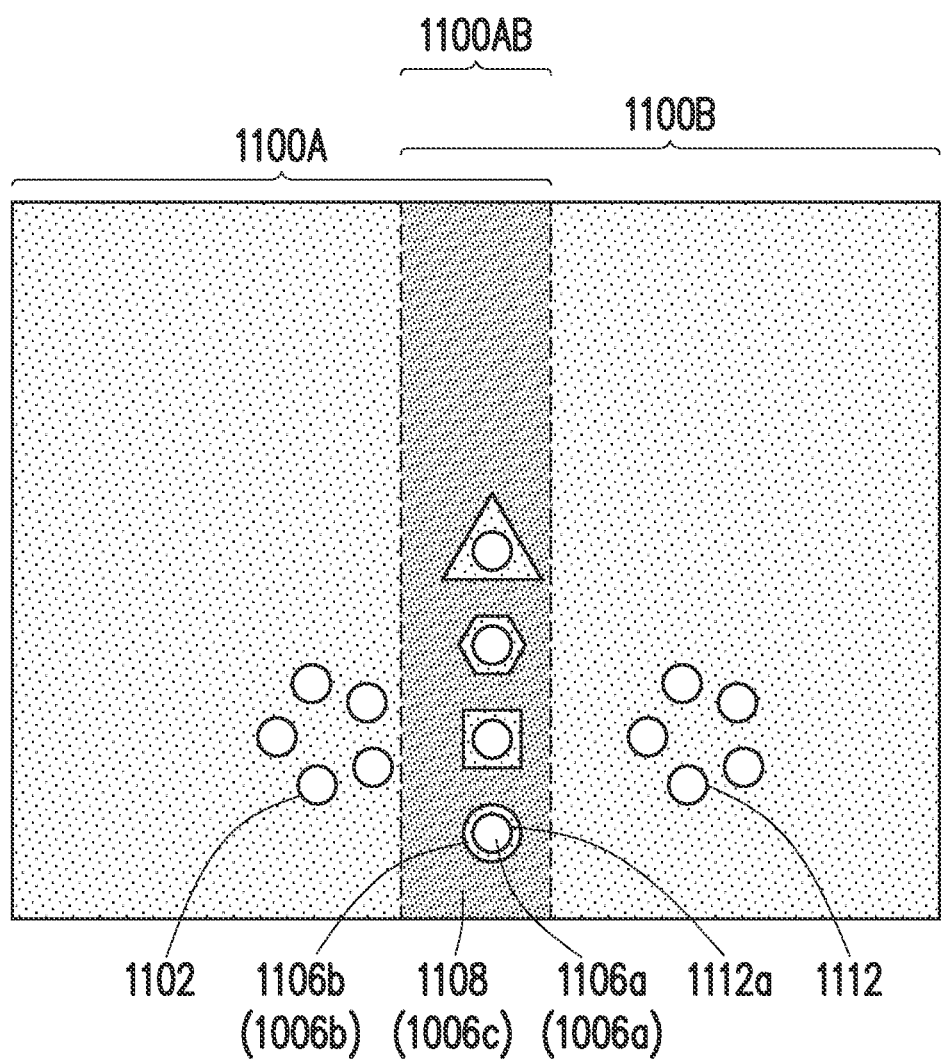
FIGS. 8A to 8C are top view diagrams of an integrated circuit workpiece undergoing a method of multiple-mask multiple-exposure patterning according to various embodiments of the present disclosure.
Figure 8B:
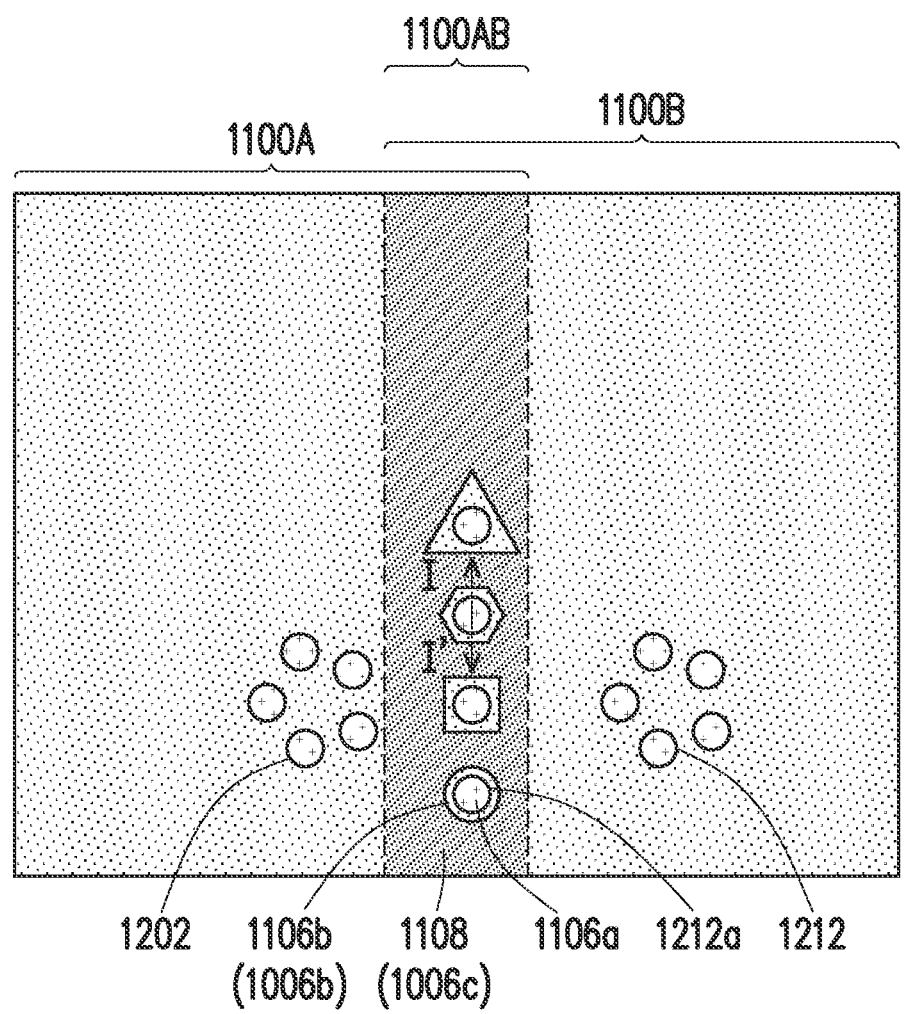
Figure 8C:
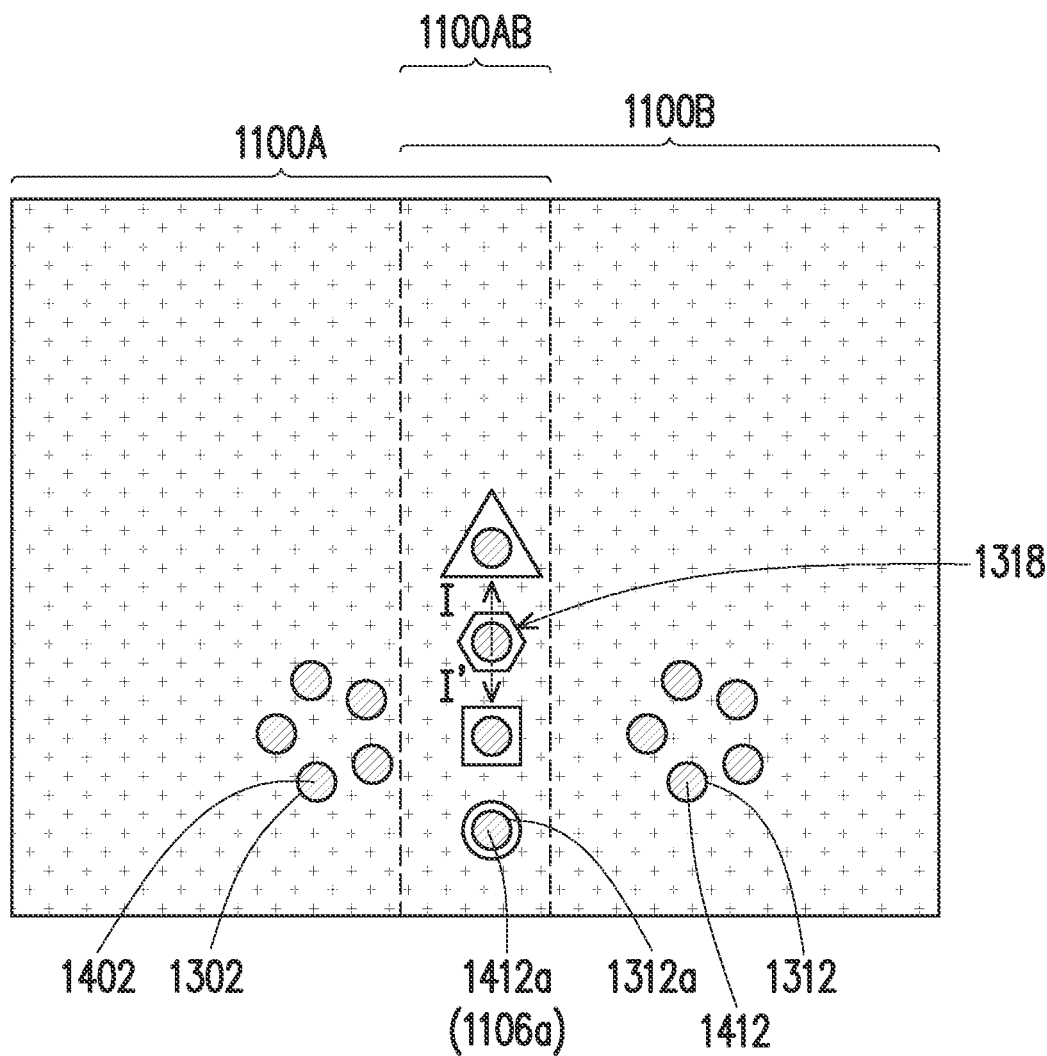
Figure 9A:
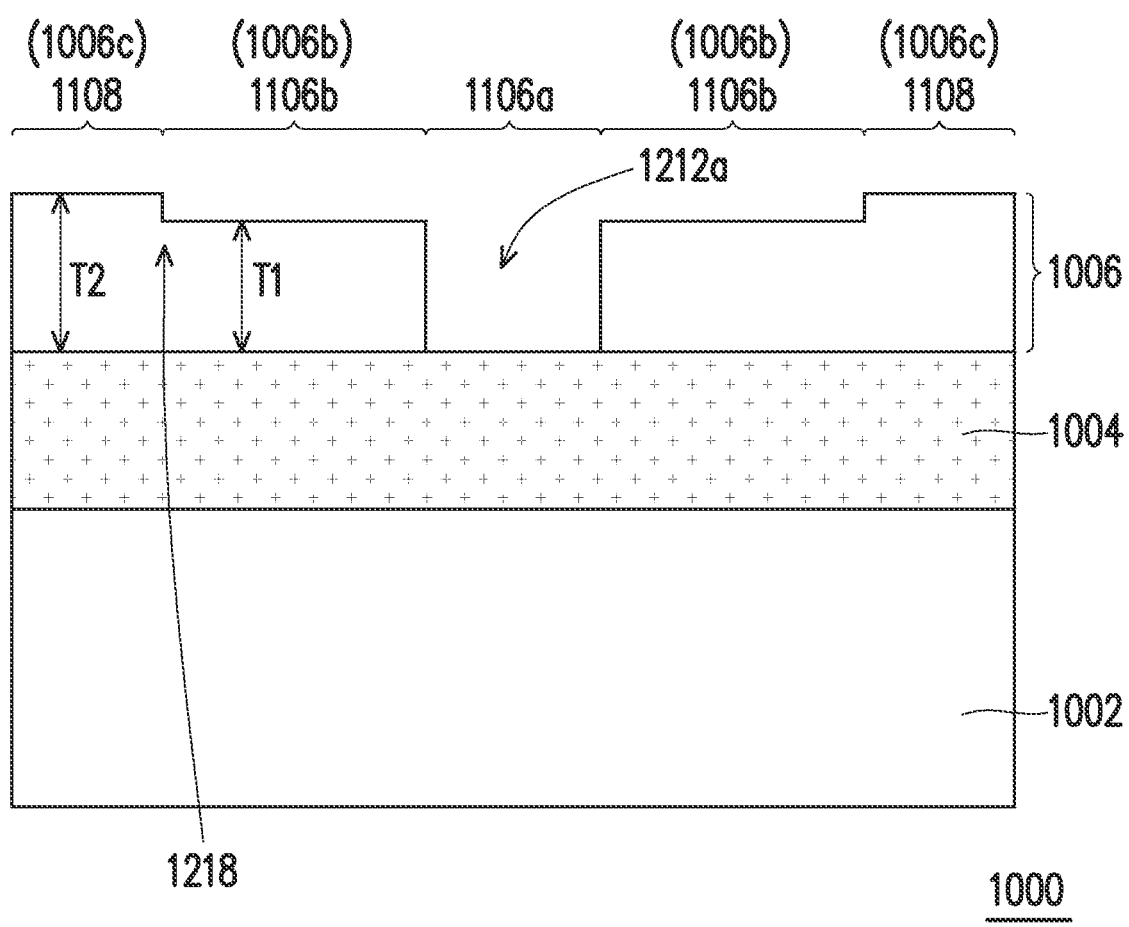
FIGS. 9A and 9B are cross-sectional diagrams of the integrated circuit workpiece along a line I-I' of FIGS. 8B and 8C.
Figure 9B:
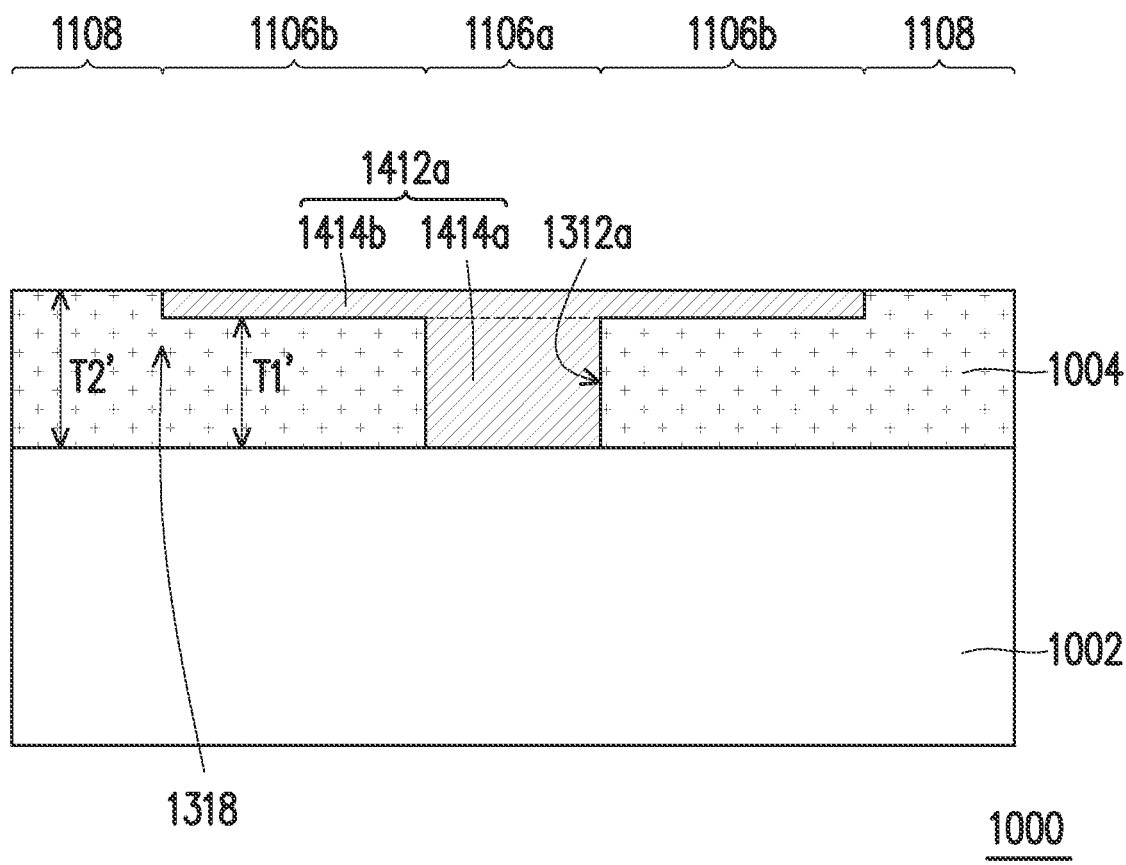

FIGS. 8A to 8C are top view diagrams of an integrated circuit workpiece undergoing a method of multiple-mask multiple-exposure patterning according to various embodiments of the present disclosure. FIGS. 9A and 9B are cross-sectional diagrams of the integrated circuit workpiece along a line I-I' of FIGS. 8B and 8C. The patterning method is similar to the patterning method of FIGS. 2A-2E and 3A-3C, and the main difference lies in using the first mask 100b and the second mask 200b. Referring to FIG. 8A, the photoresist 1006 is exposed by the first and second lithographic exposures with the first and second masks 100b and 200b. In some embodiments, the photoresist 1006 includes an unexposed portion 1006a in the region 1106a during the first and second lithographic exposures, a portion 1006b in the region 1106b exposed once by the second lithographic exposure and a portion 1006c in the region 1108 exposed twice by the first and second lithographic exposures. The unexposed portion 1006a, the portion 1006b and the portion 1006c are similar to those in FIG. 2C.

Referring to FIGS. 8B and 9A, the photoresist 1006 is developed. In some embodiments, patterns 1102, 1112, 1112a are removed to form patterns 1202, 1212, 1212a in the photoresist 1006 respectively. The pattern 1202, 1212, 1212a and the portion 1006b and the portion 1006c are similar to those in FIGS. 2D and 3B. For example, a thickness T1 of the portion 1006b is smaller than a thickness T2 of the portion 1006c, and a mark 1218 is formed between the region 1106b and the region 1108. In such embodiments, the mask feature 206a may be entirely transferred onto the photoresist 1006 on the integrated circuit workpiece 1000.

Referring to FIGS. 8C and 9B, the patterned photoresist 1006 is used to selectively process exposed portions of the material layer 1004, and then the patterned photoresist 1006 is removed. In the illustrated embodiments, the exposed portions of the material layer 1004 are etched to form patterns 1302, 1312, 1312a, and then patterns 1402, 1412, 1412a are formed in the patterns 1302, 1312, 1312a respectively. In some embodiments, as shown in FIG. 9B, the patterned material layer 1004 has topography similar to the patterned photoresist 1006 of FIG. 9A since the patterned photoresist 1006 is used to pattern the material layer 1004. In detail, a thickness T1' of the patterned material layer 1004 in the region 1106b is smaller than a thickness T2' of the patterned material layer 1004 in the region 1108. The thickness difference between the patterned material layer 1004 in the region 1106b and the region 1108 may be in a range of 0-3 μm. In such embodiments, due to the thickness difference, a mark 1318 may be seen between the region 1106b and the region 1108. In some embodiments, since the thickness difference may be small with respect to the thickness of the material layer 1004 in the region 1106b and the region 1108, the mark 1318 is light. In some embodiments, the pattern 1412a formed in the pattern 1312a is partially extended onto the region 1106b. For example, the pattern 1412a includes a via portion 1414a in the region 1106a and a line portion 1414b in the region 1106b, and the pattern 1412 may be formed by a dual damascene process. However, the disclosure is not limited thereto. In alternative embodiments, the patterned material layer 1004 in different regions such as the regions 1106b and 1108 may have substantially the same thickness, and thus the pattern 1412a is similar to that of FIG. 3C.

Figure 10A:
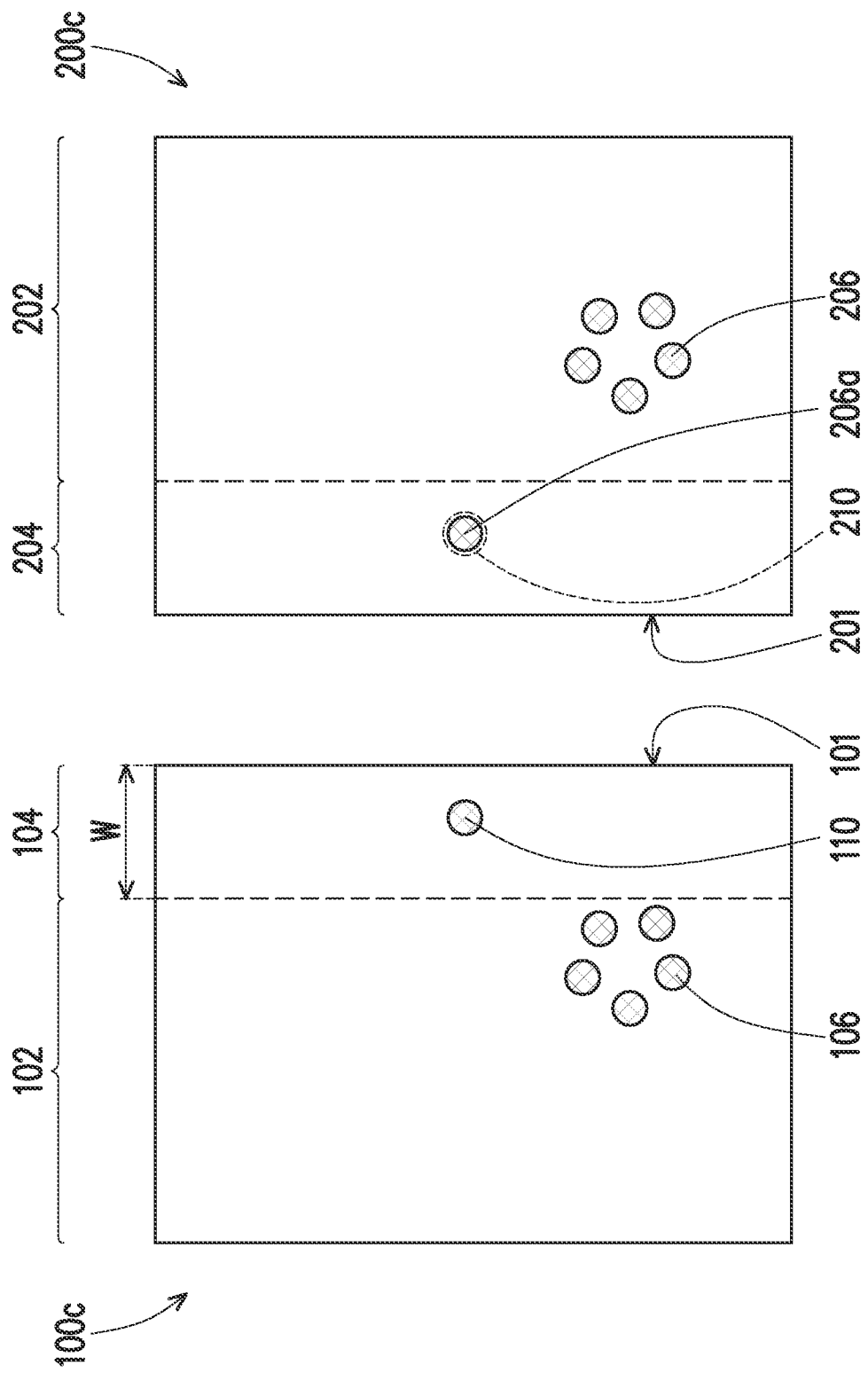
FIG. 10A shows portions of adjacent masks according to various embodiments of the present disclosure.
Figure 10B:
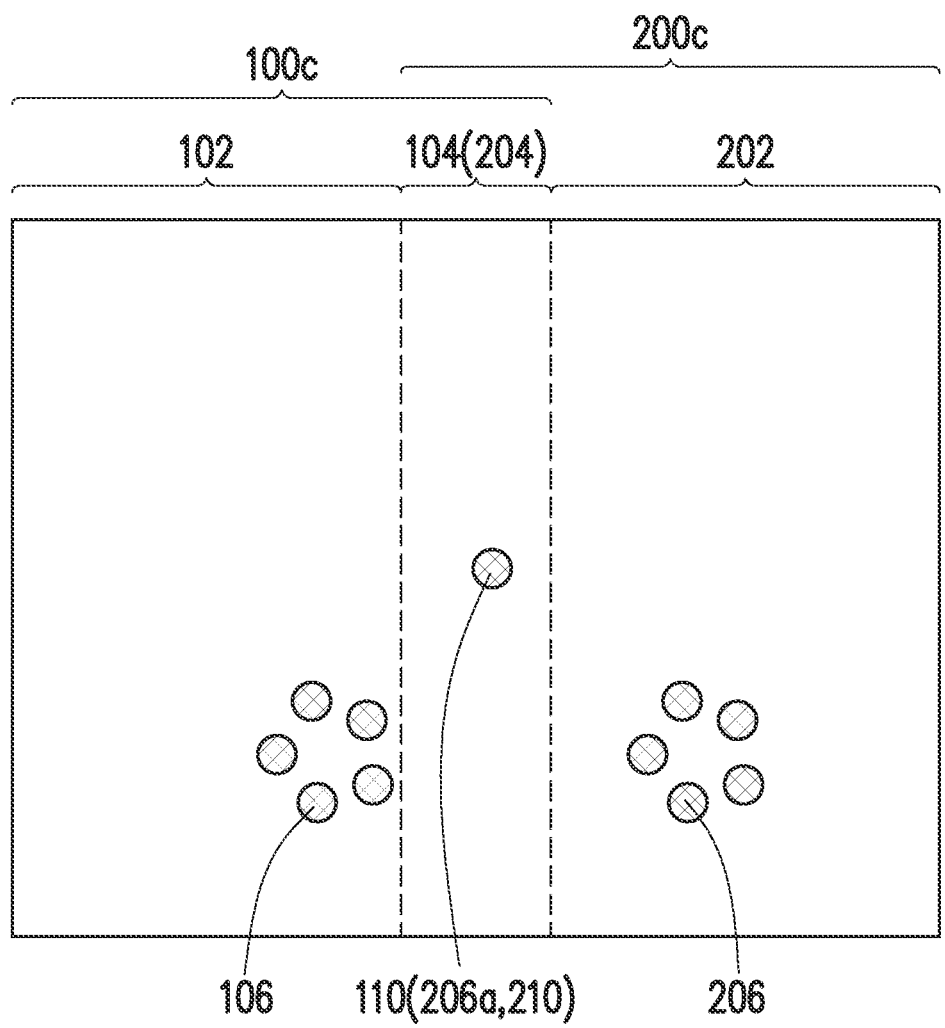
FIG. 10B shows an imaginary diagram of overlapping the stitching regions of the adjacent masks of FIG. 10A.

FIG. 10A shows portions of adjacent masks according to various embodiments of the present disclosure, and FIG. 10B shows an imaginary diagram of overlapping the stitching regions of the adjacent masks of FIG. 10A. The first mask 100c and the second mask 200c are similar to the first mask 100a and the second mask 200a respectively, and the main difference lies in the configuration of the opaque region. In some embodiments, as shown in FIGS. 10A and 10B, the corresponding unexposed area of the opaque region 110 in the stitching region 104 of the first mask 100c fully overlaps with the corresponding exposure area of the mask feature 206a in the stitching region 204 of the second mask 200c. For example, when the mask feature 206a of the second mask 200 includes an opaque region 210 in the stitching region 204, the opaque region 110 fully overlaps with the opaque region 210, and a total area of the opaque region 110 is substantially the same as a total area of the opaque region 210. In other words, as shown in FIG. 10B, the periphery of the opaque region 110 may be coincided with the periphery of the mask feature 206a. By this configuration, the mask feature 206a may be entirely transferred onto the photoresist on the integrated circuit workpiece.

Figure 11A:
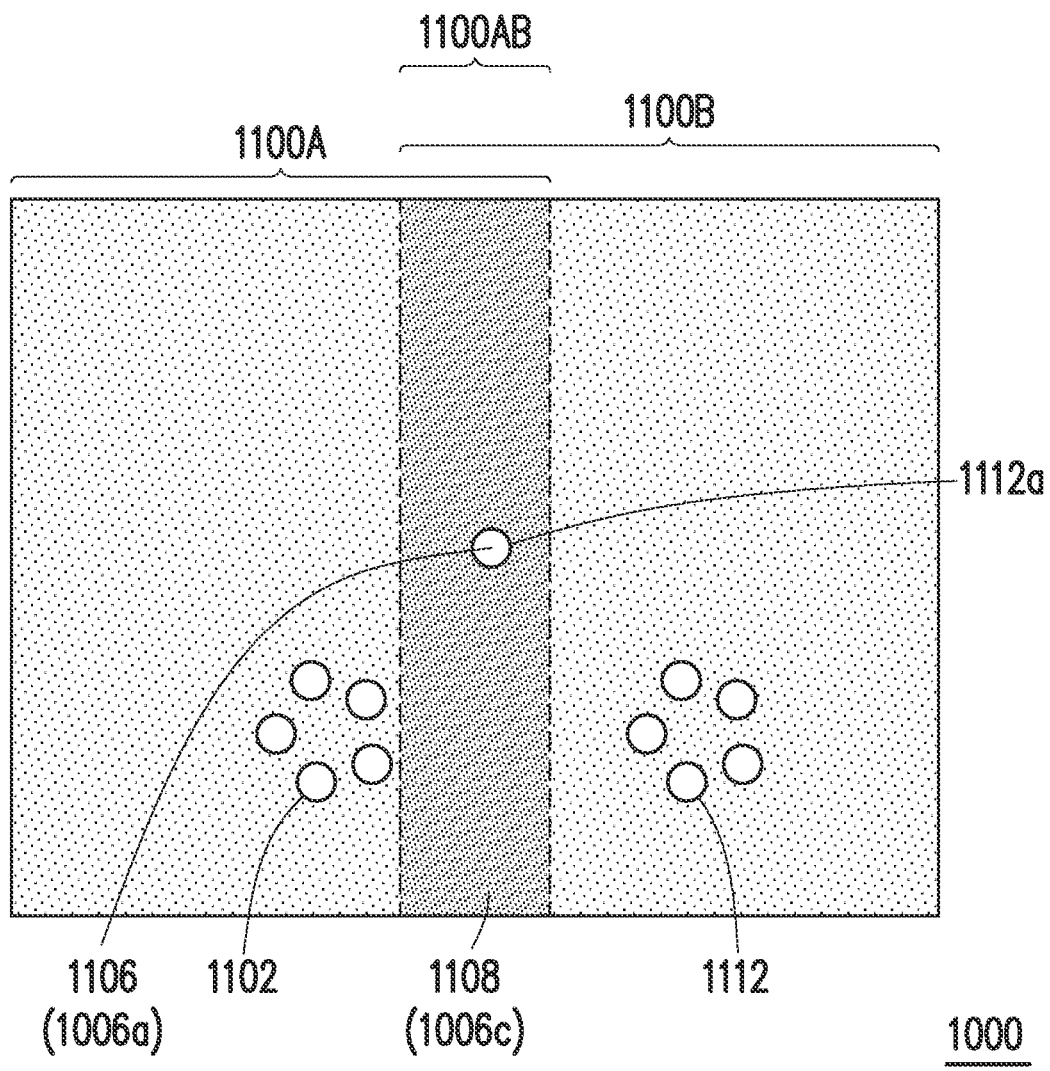
FIGS. 11A to 11C are top view diagrams of an integrated circuit workpiece undergoing a method of multiple-mask multiple-exposure patterning according to various embodiments of the present disclosure.
Figure 11B:
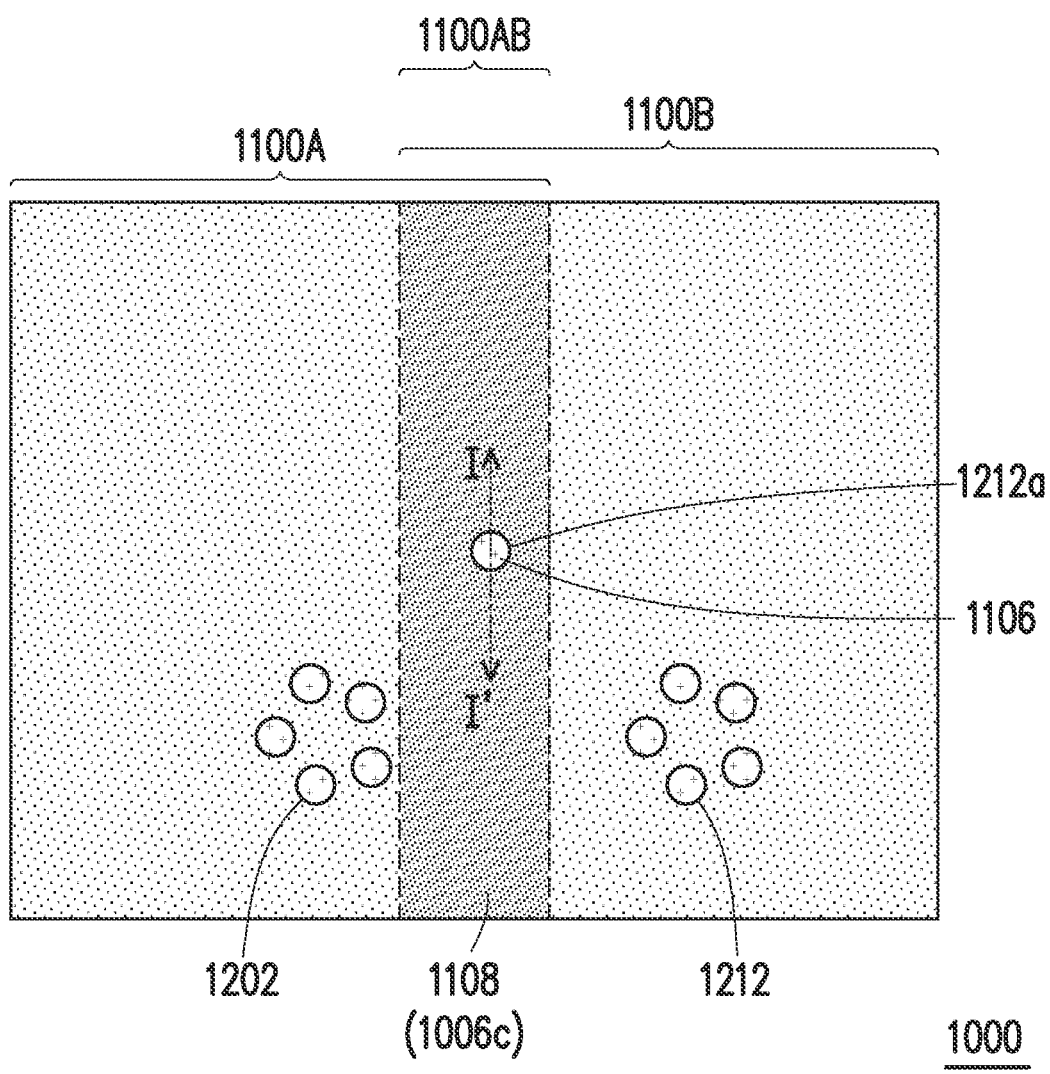
Figure 11C:
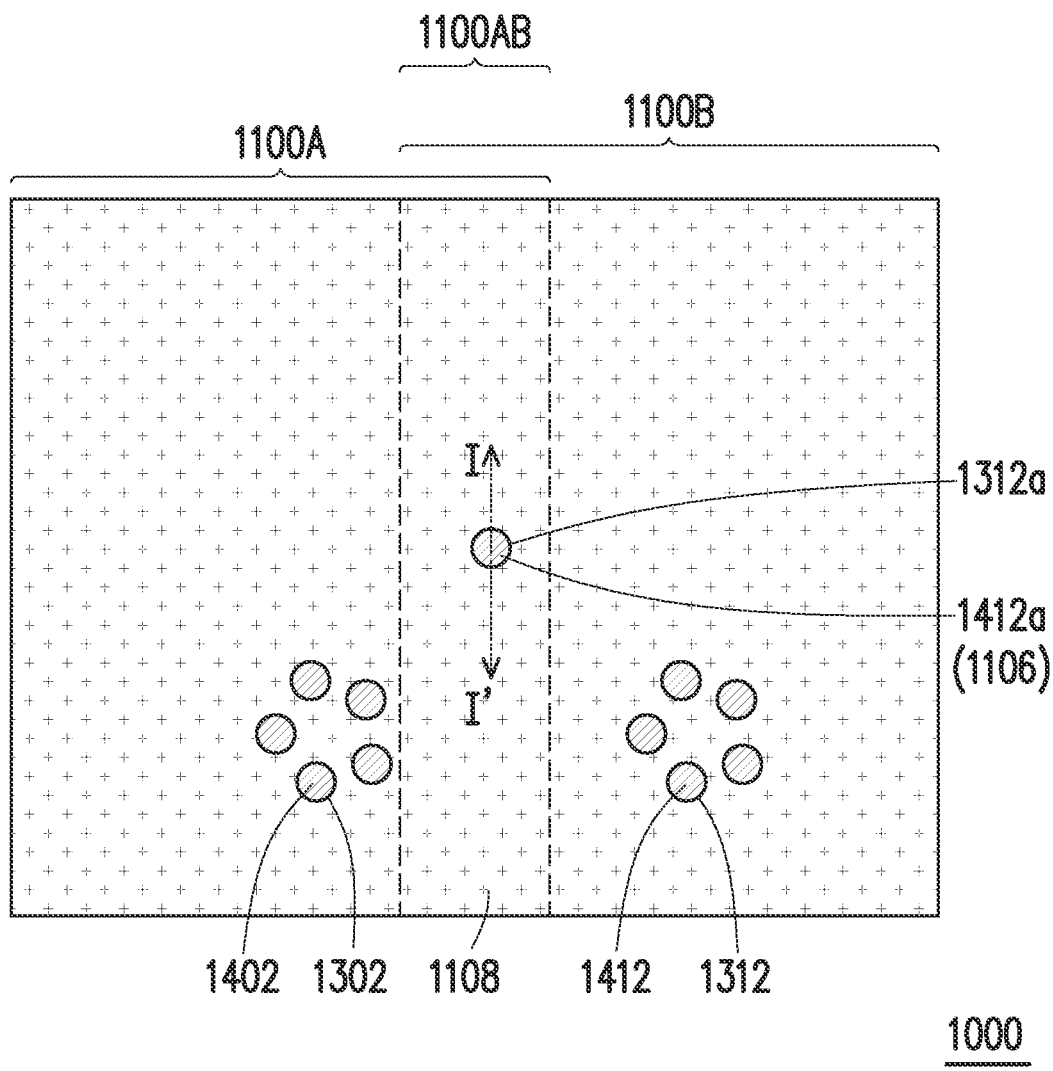
Figure 12A:
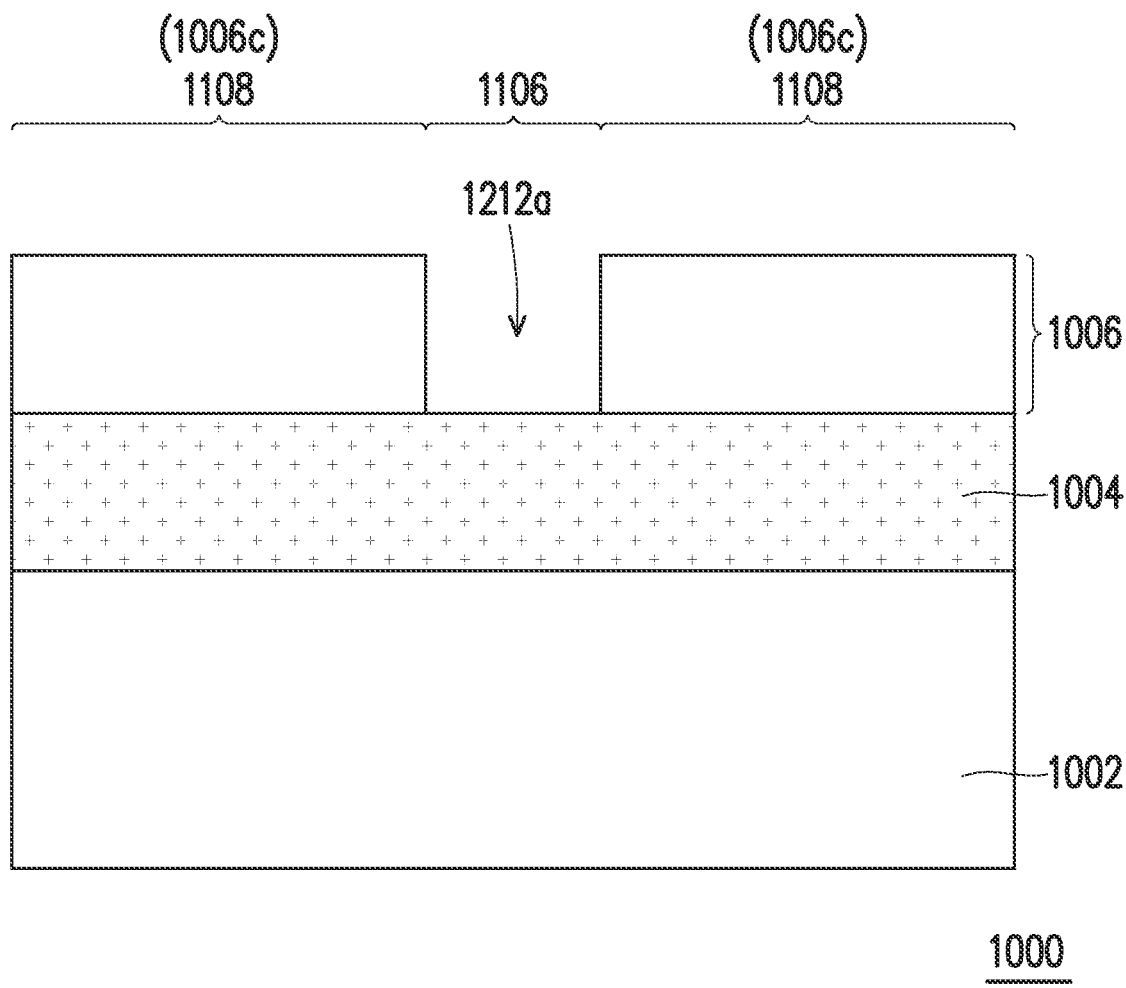
FIGS. 12A and 12B are cross-sectional diagrams of the integrated circuit workpiece along a line I-I' of FIGS. 11B and 11C.
Figure 12B:
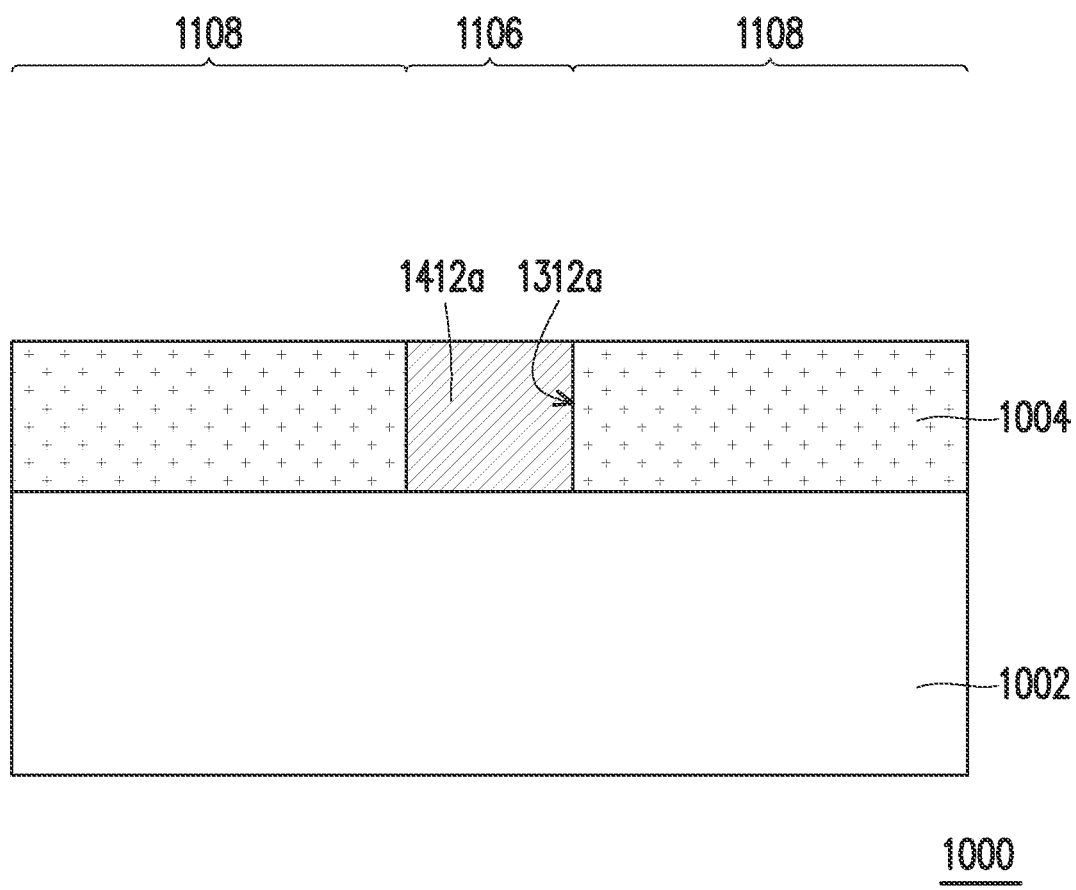

FIGS. 11A to 11C are top view diagrams of an integrated circuit workpiece undergoing a method of multiple-mask multiple-exposure patterning according to various embodiments of the present disclosure. FIGS. 12A and 12B are cross-sectional diagrams of the integrated circuit workpiece along a line I-I' of FIGS. 11B and 11C. The patterning method is similar to the patterning method of FIGS. 2A-2E and 3A-3C, and the main difference lies in using the first mask 100c and the second mask 200c. Referring to FIG. 11A, the photoresist 1006 is exposed by the first and second lithographic exposures with the first and second masks 100c and 200c. In some embodiments, the corresponding unexposed area of the opaque region 110 of the first mask 100c fully overlaps with the corresponding unexposed area of the opaque region 210 of the first mask 100c, and thus the region 1106 is entirely unexposed. Accordingly, the photoresist 1006 in the region 1100AB includes an unexposed portion 1006a in the region 1106 during the first and second lithographic exposures and a portion 1006c in the region 1108 exposed twice by the first and second lithographic exposures.

Referring to FIGS. 11B and 12A, the photoresist 1006 is developed. In some embodiments, patterns 1102, 1112, 1112a are removed to form patterns 1202, 1212, 1212a in the photoresist 1006 respectively. In some embodiments, as shown in FIG. 12A, a thickness of the remained photoresist 1006 in the region 1100AB is substantially the same. In such embodiments, the mask feature 206a may be entirely transferred onto the photoresist 1006 on the integrated circuit workpiece 1000.

Referring to FIGS. 11C and 12B, the patterned photoresist 1006 is used to selectively process exposed portions of the material layer 1004, and then the patterned photoresist 1006 is removed. In the illustrated embodiments, the exposed portions of the material layer 1004 are etched to form patterns 1302, 1312, 1312a, and then patterns 1402, 1412, 1412a are formed in the patterns 1302, 1312, 1312a respectively. The patterns 1302, 1312, 1312a, 1402, 1412, 1412a are similar to those in FIGS. 2E and 3C.

In the multiple-mask multiple-exposure process, the stitching region of a first mask is a region where the corresponding exposure area overlaps with that of a second mask. In some embodiments, the first mask is designed to have an opaque region corresponding to the mask feature of the second mask in the stitching region. Thus, the corresponding area of the opaque region is unexposed during the first lithographic exposure with the first mask, and exposed during the second lithographic exposure with the second mask. In other words, the corresponding area may be merely exposed during the lithographic exposure with the second mask. Thus, the corresponding area would be exposed once rather than twice, and the mask feature of the second mask may be successfully transferred.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

In accordance with some embodiments of the disclosure, a method includes the following steps. A photoresist is exposed to a first light-exposure through a first mask, wherein the first mask includes a first stitching region, and a portion of the photoresist corresponding to a portion of the first stitching region is unexposed during the first light-exposure. The photoresist is exposed to a second light-exposure through a second mask, wherein the second mask includes a second stitching region and a functional feature in the second stitching region, and the portion of the photoresist is exposed by the functional feature during the second light-exposure.

In accordance with some embodiments of the disclosure, a method includes the following steps. A negative photoresist layer is formed over a dielectric layer. A stitching region of the negative photoresist layer is exposed to a first light-exposure through a first mask, to form an exposed portion and an unexposed portion in the stitching region. After exposing the negative photoresist to the first light-exposure, the stitching region of the negative photoresist is exposed to a second light-exposure through a second mask, wherein a first portion of the unexposed region is exposed during the second light-exposure while a second portion of the unexposed region remains unexposed. After the second light-exposure, the photoresist is developed.

In accordance with some embodiments of the disclosure, a method includes the following steps. A negative photoresist is formed over a dielectric layer. An overlap region of the negative photoresist is exposed to a first light-exposure through a first mask, wherein a portion of the overlap region is unexposed. After exposing the negative photoresist to the first light-exposure, the overlap region of the negative photoresist is exposed to a second light-exposure through a second mask, wherein the portion of the overlap region remains unexposed. The negative photoresist is developed to remove the portion of the overlap region, to form an opening in the overlap region. The dielectric layer is patterned to form a via hole.

In accordance with some embodiments of the disclosure, a method includes the following steps. A photoresist is exposed to a first light-exposure through a first mask, wherein the first mask includes a first stitching region, and a first portion of the photoresist corresponding to a first opaque portion of the first stitching region is unexposed. The photoresist is exposed to a second light-exposure through a second mask, wherein the second mask includes a second stitching region, and a second portion of the photoresist corresponding to a second opaque portion of the second stitching region is unexposed and is overlapping with the first portion of the photoresist.

In accordance with some embodiments of the disclosure, a method includes the following steps. A photoresist is exposed to a first light-exposure through a first mask, wherein a first portion of the photoresist corresponding to a first opaque portion of the first mask is unexposed. The photoresist is exposed to a second light-exposure through a second mask, wherein a second portion of the photoresist corresponding to a second opaque portion of the second mask is unexposed, and a periphery of the second portion of the photoresist is surrounded by a periphery of the first portion of the photoresist.

In accordance with some embodiments of the disclosure, a method includes the following steps. A photoresist is exposed to a first light-exposure through a first mask. The photoresist is exposed to a second light-exposure through a second mask. The photoresist is developed, wherein the photoresist has a first region having a first thickness, a second region having a second thickness, a third region having a third thickness, the first thickness is smaller than the second thickness, the second thickness is smaller than the third thickness, and the second region is disposed between the first region and the third region.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method, comprising:
   exposing a photoresist to a first light-exposure through a first mask, wherein the first mask includes a first stitching region, and a first portion of the photoresist corresponding to a first opaque portion of the first stitching region is unexposed; and
   exposing the photoresist to a second light-exposure through a second mask, wherein the second mask includes a second stitching region, and a second portion of the photoresist corresponding to a second opaque portion of the second stitching region is unexposed and is overlapping with the first portion of the photoresist.

2. The method of claim 1, wherein the second portion of the photoresist is partially overlapping with the first portion of the photoresist and partially not overlapping with the first portion of the photoresist.

3. The method of claim 1, wherein the second mask further comprises a main region aside the second stitching region, and the second opaque portion is partially disposed in the second stitching region and partially disposed in the main region.

4. The method of claim 1, wherein the second portion of the photoresist is entirely overlapping with the first portion of the photoresist.

5. The method of claim 1, wherein a total area of the first opaque region is larger than a total area of the second opaque region.

6. The method of claim 1, wherein the second opaque portion is a functional feature.

7. A method, comprising:
   exposing a photoresist to a first light-exposure through a first mask, wherein a first portion of the photoresist corresponding to a first opaque portion of the first mask is unexposed; and
   exposing the photoresist to a second light-exposure through a second mask, wherein a second portion of the photoresist corresponding to a second opaque portion of the second mask is unexposed, and a periphery of the second portion of the photoresist is surrounded by a periphery of the first portion of the photoresist.

8. The method of claim 7, wherein the photoresist is a negative photoresist.

9. The method of claim 7, wherein the second portion of the photoresist has a shape of a circle.

10. The method of claim 7, wherein the first region of the photoresist has a shape of a polygon or a circle.

11. The method of claim 7, wherein the periphery of the second portion of the photoresist is coincided with the periphery of the first portion of the photoresist.

12. The method of claim 7, wherein the periphery of the second portion of the photoresist and the periphery of the first portion of the photoresist are separated by a distance.

13. The method of claim 7, wherein the photoresist includes a third portion surrounding the first portion, and the third portion is exposed during the first light-exposure and the second light-exposure.

14. The method of claim 13, wherein after developing, a thickness of the third portion is larger than a thickness of the first portion and the second portion.

15. The method of claim 13, wherein the first portion and the third portion of the photoresist correspond to a first stitching region of the first mask.

16. A method, comprising:
- exposing a photoresist to a first light-exposure through a first mask;
- exposing the photoresist to a second light-exposure through a second mask; and
- developing the photoresist, wherein the photoresist has a first region having a first thickness, a second region having a second thickness, a third region having a third thickness, the first thickness is smaller than the second thickness, the second thickness is smaller than the third thickness, and the second region is disposed between the first region and the third region.

17. The method of claim 16, wherein the first region is exposed during both the first light-exposure and the second light-exposure, the second region is exposed during one of the first light-exposure and the second light-exposure, and the third region is unexposed during both the first light-exposure and the second light-exposure.

18. The method of claim 16, wherein the first region penetrates through the photoresist.

19. The method of claim 16, wherein the first region has a shape of a circle.

20. The method of claim 16, wherein the first region, the second region and the third region of the photoresist correspond to a stitching region of the first mask and the second mask.

* * * * *